United States Patent
Merced-Grafals et al.

(10) Patent No.: US 10,354,724 B2
(45) Date of Patent: Jul. 16, 2019

(54) METHODS AND APPARATUS FOR PROGRAMMING BARRIER MODULATED MEMORY CELLS

(71) Applicant: SANDISK TECHNOLOGIES LLC, Plano, TX (US)

(72) Inventors: Emmanuelle Merced-Grafals, San Jose, CA (US); Juan P. Saenz, Menlo Park, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 15/706,562

(22) Filed: Sep. 15, 2017

(65) Prior Publication Data
US 2019/0088323 A1   Mar. 21, 2019

(51) Int. Cl.
*G11C 11/00* (2006.01)
*G11C 13/00* (2006.01)

(52) U.S. Cl.
CPC ...... *G11C 13/0007* (2013.01); *G11C 13/0069* (2013.01); *G11C 2213/31* (2013.01); *G11C 2213/71* (2013.01)

(58) Field of Classification Search
CPC ............ G11C 13/0007; G11C 13/0069; G11C 2213/31; G11C 2213/71
USPC ........................................................ 365/148
See application file for complete search history.

(56) References Cited

U.S. PATENT DOCUMENTS

| | | | | |
|---|---|---|---|---|
| 7,362,610 B1* | 4/2008 | Salter, III | ........... | G11C 16/3418 365/185.02 |
| 8,040,721 B2* | 10/2011 | Thorp | ................ | G11C 13/0004 365/148 |
| 9,007,840 B2* | 4/2015 | Park | .................... | G11C 16/3454 365/185.01 |
| 9,230,663 B1* | 1/2016 | Lu | ........................ | G11C 11/5628 |
| 9,373,390 B1* | 6/2016 | Lee | ..................... | G11C 16/3454 |
| 10,157,668 B2* | 12/2018 | Whitaker | ........... | G11C 13/0064 |
| 2005/0248992 A1* | 11/2005 | Hwang | .................. | G11C 16/10 365/185.28 |
| 2008/0101124 A1* | 5/2008 | Sivero | .................... | G11C 16/12 365/185.18 |
| 2010/0064096 A1 | 3/2010 | Weingarten et al. | | |
| 2010/0195370 A1 | 8/2010 | Shiimoto et al. | | |

(Continued)

OTHER PUBLICATIONS

U.S. Appl. No. 15/691,801, filed Aug. 31, 2017.
(Continued)

*Primary Examiner* — Viet Q Nguyen
(74) *Attorney, Agent, or Firm* — Vierra Magen Marcus LLP

(57) ABSTRACT

A memory device is provided that includes a memory controller coupled to a memory array. The memory controller is adapted to perform a closed loop training interval and perform an open loop programming interval. The closed loop training interval determines a corresponding first state successful voltage and a corresponding second state successful voltage for a first group of memory cells each including a barrier modulated switching structure. The open loop programming interval programs a second group of memory cells each including a barrier modulated switching structure to a first state and a second state using the corresponding first state successful voltage and the corresponding second state successful voltage, respectively.

13 Claims, 21 Drawing Sheets

(56) References Cited

U.S. PATENT DOCUMENTS

| | | | |
|---|---|---|---|
| 2010/0284212 A1* | 11/2010 | Bedeschi | G11C 11/5678 365/163 |
| 2011/0299334 A1* | 12/2011 | Honma | G11C 16/0483 365/185.03 |
| 2012/0230085 A1 | 9/2012 | Kawai et al. | |
| 2013/0016558 A1* | 1/2013 | Ahn | G11C 16/0483 365/185.03 |
| 2013/0176783 A1* | 7/2013 | Senoo | G11C 16/10 365/185.09 |
| 2014/0268998 A1 | 9/2014 | Jo | |
| 2016/0019947 A1* | 1/2016 | Pang | G11C 11/5628 365/185.03 |
| 2016/0019948 A1* | 1/2016 | Pang | G11C 11/5628 365/185.03 |
| 2016/0148695 A1* | 5/2016 | Kim | G11C 16/12 365/185.03 |
| 2016/0179412 A1 | 6/2016 | Camp et al. | |
| 2016/0211032 A1* | 7/2016 | Pang | G11C 11/5621 |
| 2017/0154677 A1* | 6/2017 | Lim | G11C 16/10 |
| 2017/0256320 A1* | 9/2017 | Lang | G11C 16/26 |
| 2018/0068739 A1* | 3/2018 | Shiino | G11C 16/10 |
| 2018/0151236 A1* | 5/2018 | Park | G11C 11/5628 |
| 2018/0277208 A1* | 9/2018 | Kamalanathan | G11C 13/0069 |

OTHER PUBLICATIONS

Requirement for Restriction/Election dated May 9, 2018 in U.S. Appl. No. 15/691,801.
Response to Requirement for Restriction/Election filed Jun. 28, 2018 in U.S. Appl. No. 15/691,801.
Office Action dated Aug. 9, 2018 in U.S. Appl. No. 15/691,801.
Response to Office Action filed Nov. 6, 2018 in U.S. Appl. No. 15/691,801.
Final Office Action dated Jan. 3, 2019 in U.S. Appl. No. 15/691,801.

* cited by examiner

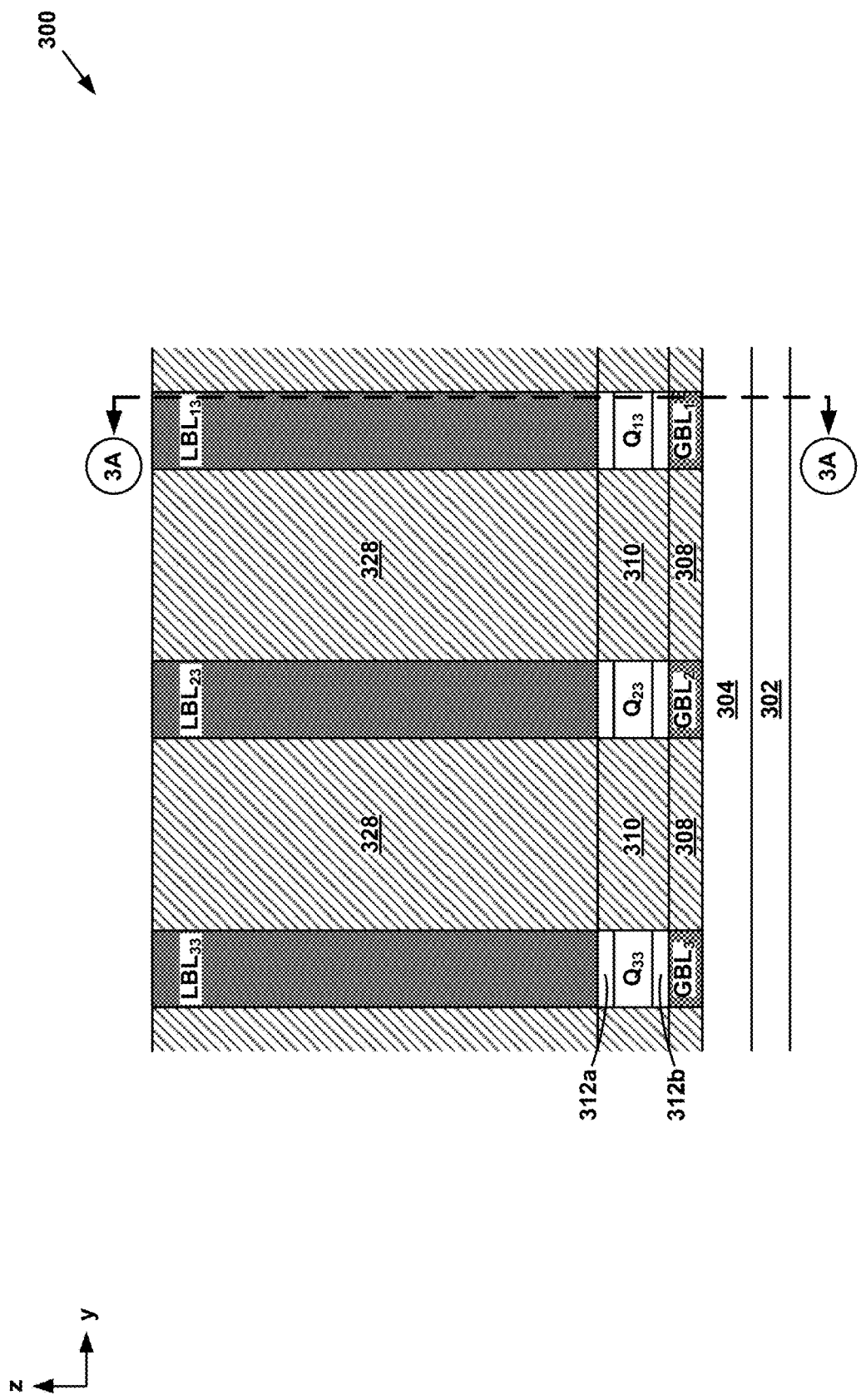

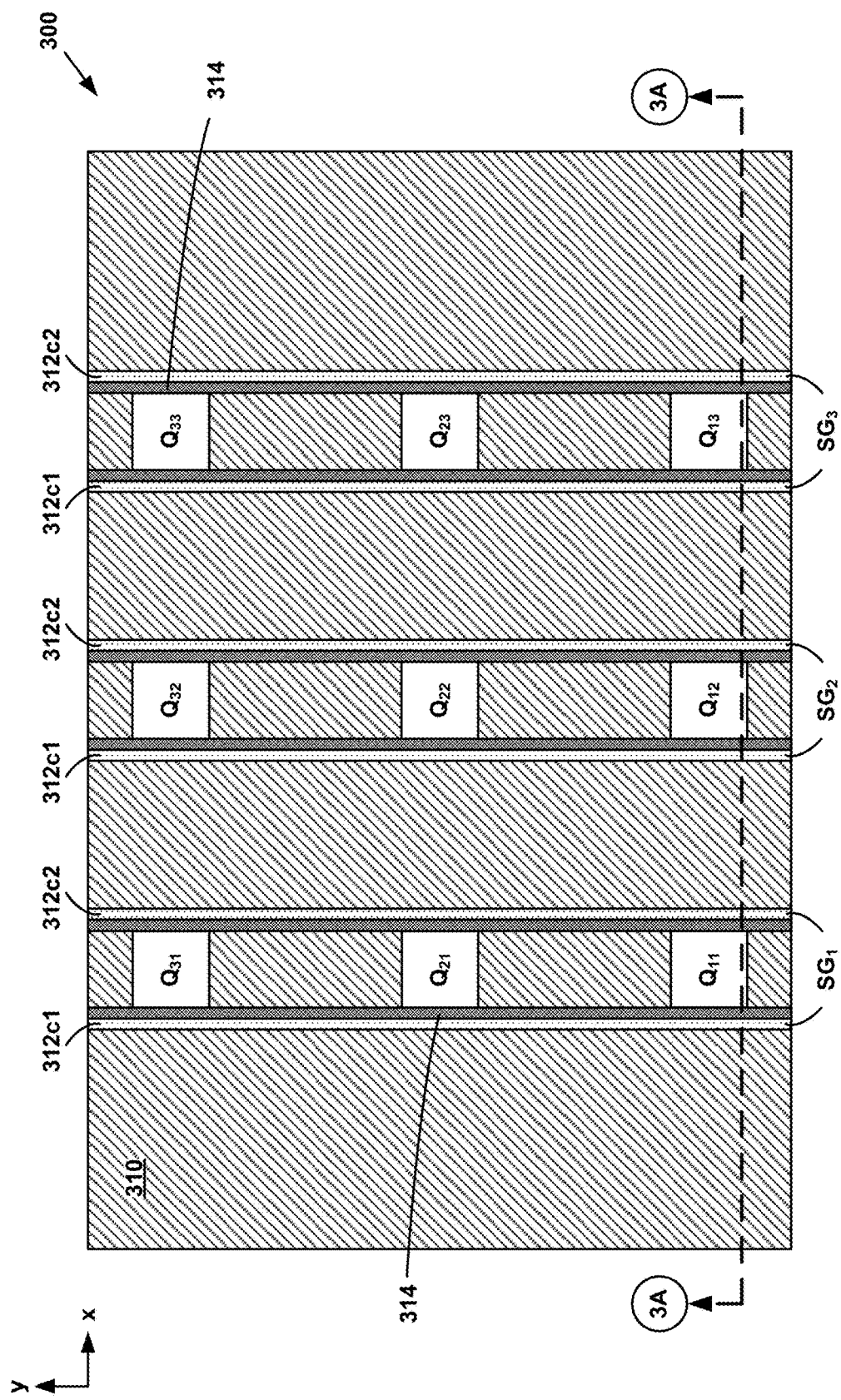

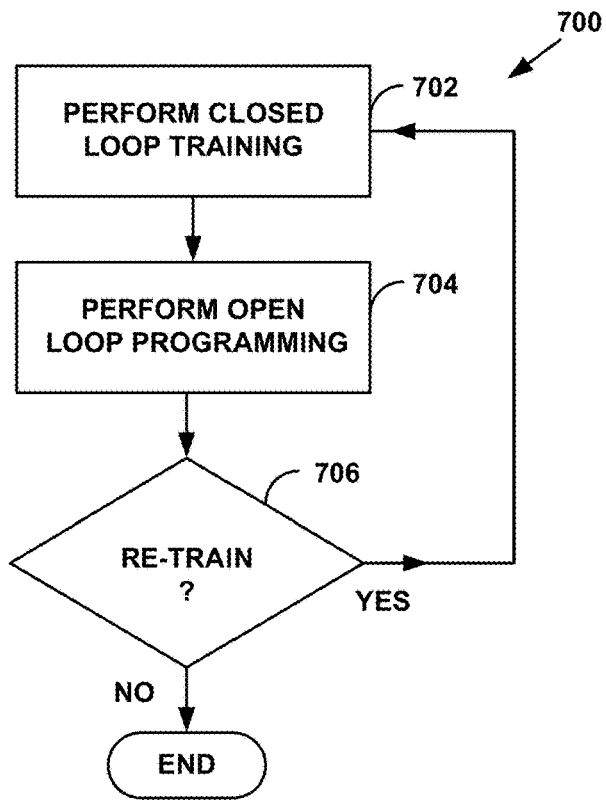
FIG. 7A
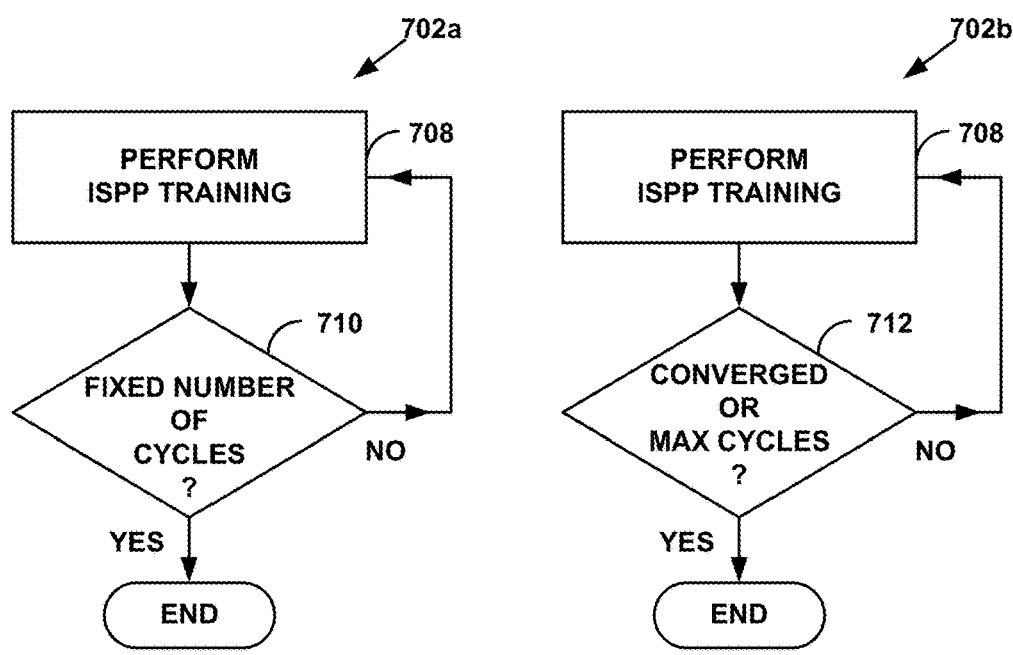
FIG. 7B
FIG. 7C

METHODS AND APPARATUS FOR PROGRAMMING BARRIER MODULATED MEMORY CELLS

BACKGROUND

Semiconductor memory is widely used in various electronic devices such as mobile computing devices, mobile phones, solid-state drives, digital cameras, personal digital assistants, medical electronics, servers, and non-mobile computing devices. Semiconductor memory may include non-volatile memory or volatile memory. A non-volatile memory device allows information to be stored or retained even when the non-volatile memory device is not connected to a power source.

One example of non-volatile memory uses memory cells that include reversible resistance-switching memory elements that may be set to either a low resistance state or a high resistance state. The memory cells may be individually connected between first and second conductors (e.g., a bit line electrode and a word line electrode). The state of such a memory cell is typically changed by proper voltages being placed on the first and second conductors.

In recent years, non-volatile memory devices have been scaled to reduce the cost per bit. However, as process geometries shrink, many design and process challenges are presented

BRIEF DESCRIPTION OF THE DRAWINGS

FIGS. 3A-3F depict various views of an embodiment monolithic three-dimensional memory array.

FIGS. 7A-7E depict methods for training and programming BMC memory cells.

DETAILED DESCRIPTION

Figure 1A:
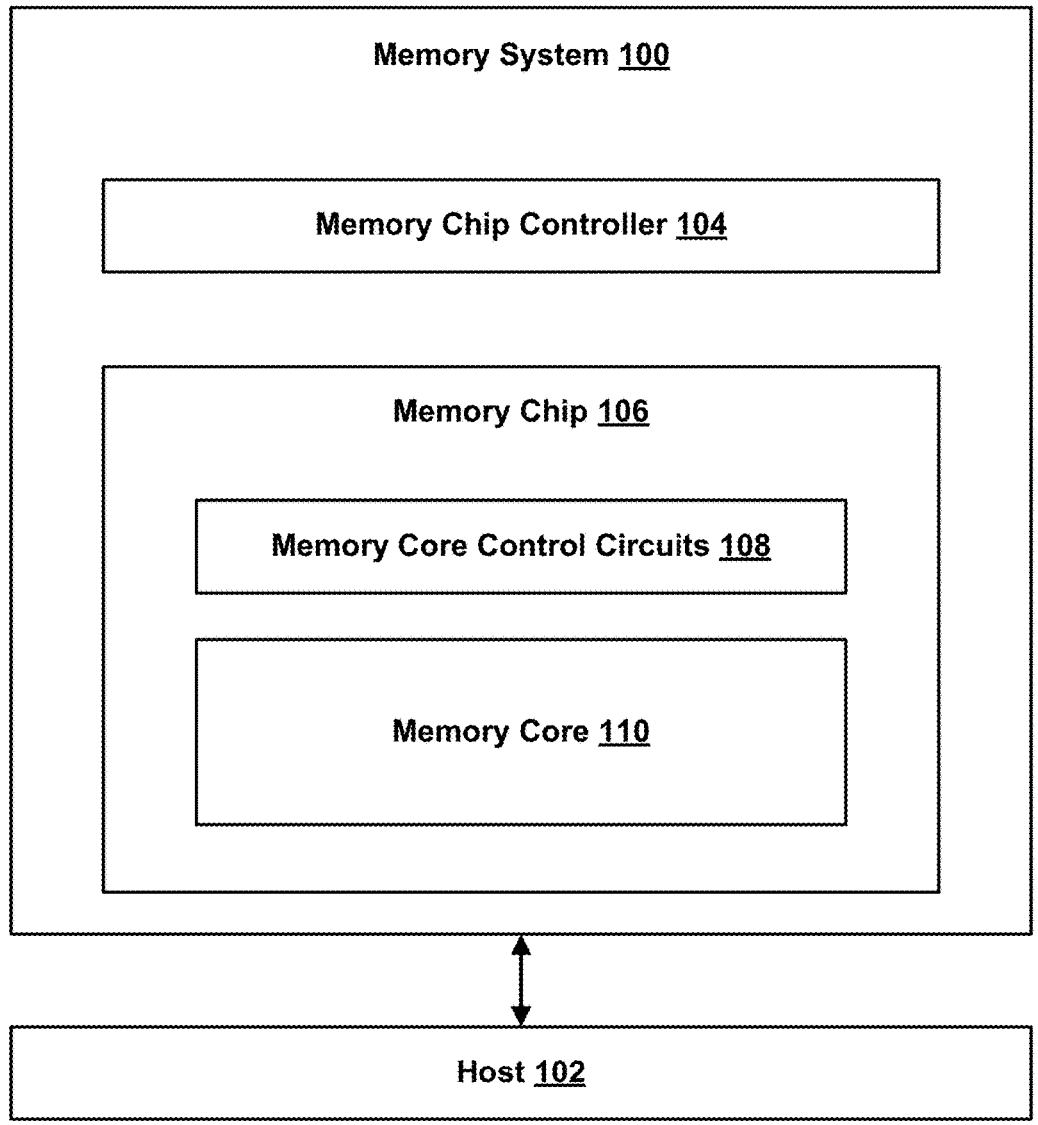
FIG. 1A depicts an embodiment of a memory system and a host.

Technology is described for programming memory cells that include a barrier modulated switching structure. A memory device is provided that includes a memory controller coupled to a memory array. The memory controller is adapted to perform a closed loop training interval and perform an open loop programming interval. The closed loop training interval determines a corresponding first state successful voltage and a corresponding second state successful voltage for a first group of memory cells each including a barrier modulated switching structure. The open loop programming interval programs a second group of memory cells each including a barrier modulated switching structure to a first state and a second state using the corresponding first state successful voltage and the corresponding second state successful voltage, respectively.

In some embodiments, a memory array may include a cross-point memory array. A cross-point memory array may refer to a memory array in which two-terminal memory cells are placed at the intersections of a first set of control lines (e.g., word lines) arranged in a first direction and a second set of control lines (e.g., bit lines) arranged in a second direction perpendicular to the first direction.

Each two-terminal memory cell may include a reversible resistance-switching memory element disposed between first and second conductors. Example reversible resistance-switching memory elements include a phase change material, a ferroelectric material, a metal oxide (e.g., hafnium oxide), a barrier modulated switching structure, or other similar reversible resistance-switching memory elements.

Example barrier modulated switching structures include a semiconductor material layer (e.g., an amorphous silicon layer) adjacent a conductive oxide material layer (e.g., a titanium oxide layer). Other example barrier modulated switching structures include a thin (e.g., less than about 2 nm) barrier oxide material (e.g., an aluminum oxide layer) disposed between a semiconductor material layer (e.g., an amorphous silicon layer) and a conductive oxide material layer (e.g., a titanium oxide layer).

Still other example barrier modulated switching structures include a barrier oxide material (e.g., an aluminum oxide layer) disposed adjacent a conductive oxide material layer (e.g., a titanium oxide layer), with no semiconductor material layer (e.g., amorphous silicon) in the barrier modulated switching structure. As used herein, a memory cell that includes a barrier modulated switching structure is referred to herein as a "BMC memory cell."

In some embodiments, each memory cell in a cross-point memory array includes a reversible resistance-switching memory element in series with a steering element or an isolation element, such as a diode, to reduce leakage currents. In other cross-point memory arrays, the memory cells do not include an isolation element.

In an embodiment, a non-volatile storage system may include one or more two-dimensional arrays of non-volatile memory cells. The memory cells within a two-dimensional memory array may form a single layer of memory cells and may be selected via control lines (e.g., word lines and bit lines) in the X and Y directions. In another embodiment, a non-volatile storage system may include one or more monolithic three-dimensional memory arrays in which two or more layers of memory cells may be formed above a single substrate without any intervening substrates.

In some cases, a three-dimensional memory array may include one or more vertical columns of memory cells located above and orthogonal to a substrate. In an example, a non-volatile storage system may include a memory array with vertical bit lines or bit lines that are arranged orthogonal to a semiconductor substrate. The substrate may include a silicon substrate. The memory array may include rewriteable non-volatile memory cells, wherein each memory cell includes a reversible resistance-switching memory element without an isolation element in series with the reversible resistance-switching memory element (e.g., no diode in series with the reversible resistance-switching memory element).

In some embodiments, a non-volatile storage system may include a non-volatile memory that is monolithically formed in one or more physical levels of arrays of memory cells having an active area disposed above a silicon substrate. The non-volatile storage system may also include circuitry associated with the operation of the memory cells (e.g., decoders, state machines, page registers, and/or control circuitry for controlling reading, programming and erasing of the memory cells). The circuitry associated with the operation of the memory cells may be located above the substrate or within the substrate.

In some embodiments, a non-volatile storage system may include a monolithic three-dimensional memory array. The monolithic three-dimensional memory array may include one or more levels of memory cells. Each memory cell within a first level of the one or more levels of memory cells may include an active area that is located above a substrate (e.g., above a single-crystal substrate or a crystalline silicon substrate). In one example, the active area may include a semiconductor junction (e.g., a P-N junction). The active area may include a portion of a source or drain region of a transistor. In another example, the active area may include a channel region of a transistor.

FIG. 1A depicts one embodiment of a memory system 100 and a host 102. Memory system 100 may include a non-volatile storage system interfacing with host 102 (e.g., a mobile computing device). In some cases, memory system 100 may be embedded within host 102. In other cases, memory system 100 may include a memory card. As depicted, memory system 100 includes a memory chip controller 104 and a memory chip 106. Although a single memory chip 106 is depicted, memory system 100 may include more than one memory chip (e.g., four, eight or some other number of memory chips). Memory chip controller 104 may receive data and commands from host 102 and provide memory chip data to host 102.

Memory chip controller 104 may include one or more state machines, page registers, SRAM, and control circuitry for controlling the operation of memory chip 106. The one or more state machines, page registers, SRAM, and control circuitry for controlling the operation of memory chip 106 may be referred to as managing or control circuits. The managing or control circuits may facilitate one or more memory array operations, such as forming, erasing, programming, sand reading operations. In an embodiment, the managing or control circuits may relocate data stored in memory chip 106.

In some embodiments, the managing or control circuits (or a portion of the managing or control circuits) for facilitating one or more memory array operations may be integrated within memory chip 106. Memory chip controller 104 and memory chip 106 may be arranged on a single integrated circuit. In other embodiments, memory chip controller 104 and memory chip 106 may be arranged on different integrated circuits. In some cases, memory chip controller 104 and memory chip 106 may be integrated on a system board, logic board, or a PCB.

Memory chip 106 includes memory core control circuits 108 and a memory core 110. Memory core control circuits 108 may include logic for controlling the selection of memory blocks (or arrays) within memory core 110, controlling the generation of voltage references for biasing a particular memory array into a read or write state, and generating row and column addresses.

Memory core 110 may include one or more two-dimensional arrays of memory cells or one or more three-dimensional arrays of memory cells. In an embodiment, memory core control circuits 108 and memory core 110 are arranged on a single integrated circuit. In other embodiments, memory core control circuits 108 (or a portion of memory core control circuits 108) and memory core 110 may be arranged on different integrated circuits.

A memory operation may be initiated when host 102 sends instructions to memory chip controller 104 indicating that host 102 would like to read data from memory system 100 or write data to memory system 100. In the event of a write (or programming) operation, host 102 will send to memory chip controller 104 both a write command and the data to be written.

The data to be written may be buffered by memory chip controller 104 and error correcting code (ECC) data may be generated corresponding with the data to be written. The ECC data, which allows data errors that occur during transmission or storage to be detected and/or corrected, may be written to memory core 110 or stored in non-volatile memory within memory chip controller 104. In an embodiment, the ECC data are generated and data errors are corrected by circuitry within memory chip controller 104.

Memory chip controller 104 controls operation of memory chip 106. In one example, before issuing a write operation to memory chip 106, memory chip controller 104 may check a status register to make sure that memory chip 106 is able to accept the data to be written. In another example, before issuing a read operation to memory chip 106, memory chip controller 104 may pre-read overhead information associated with the data to be read.

The overhead information may include ECC data associated with the data to be read or a redirection pointer to a new memory location within memory chip 106 in which to read the data requested. Once a read or write operation is initiated by memory chip controller 104, memory core control circuits 108 may generate the appropriate bias voltages for word lines and bit lines within memory core 110, and generate the appropriate memory block, row, and column addresses.

In an embodiment, memory chip controller 104 includes one or more managing or control circuits that control operation of a memory array in memory chip 106. In an embodiment, the one or more managing or control circuits provide control signals to a memory array to perform an erase operation, a read operation, and/or a write operation on the memory array. In an embodiment, in response to detecting one or more conditions, the one or more managing or control circuits relocate stored data between different portions of memory core 110.

In an embodiment, the one or more managing or control circuits include any one of or a combination of control circuitry, state machine, decoders, sense amplifiers, read/write circuits, and/or controllers. In an embodiment, the one or more managing circuits include an on-chip memory controller for determining row and column address, word line and bit line addresses, memory array enable signals, and data latching signals.

Figure 1B:
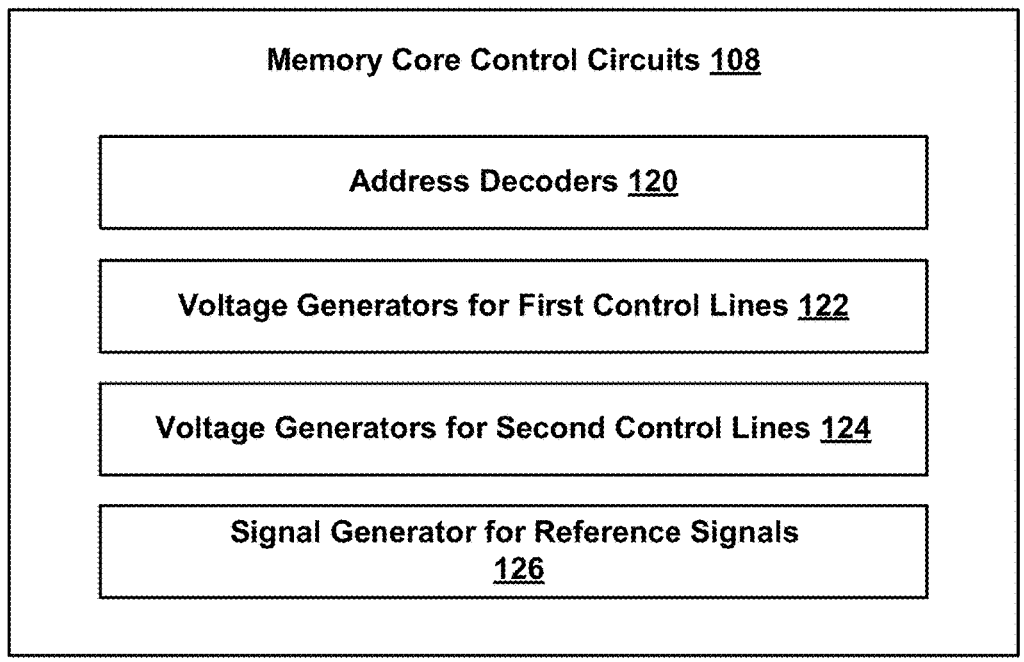
FIG. 1B depicts an embodiment of memory core control circuits.

FIG. 1B depicts one embodiment of memory core control circuits 108. As depicted, memory core control circuits 108 include address decoders 120, voltage generators for first control lines 122, voltage generators for second control lines 124 and signal generators for reference signals 126 (described in more detail below). Control lines may include word lines, bit lines, or a combination of word lines and bit lines. First control lines may include first (e.g., selected) word lines and/or first (e.g., selected) bit lines that are used to place memory cells into a first (e.g., selected) state. Second control lines may include second (e.g., unselected)

word lines and/or second (e.g., unselected) bit lines that are used to place memory cells into a second (e.g., unselected) state.

Address decoders 120 may generate memory block addresses, as well as row addresses and column addresses for a particular memory block. Voltage generators (or voltage regulators) for first control lines 122 may include one or more voltage generators for generating first (e.g., selected) control line voltages. Voltage generators for second control lines 124 may include one or more voltage generators for generating second (e.g., unselected) control line voltages. Signal generators for reference signals 126 may include one or more voltage and/or current generators for generating reference voltage and/or current signals.

FIGS. 1C-1G depict an embodiment of a memory core organization that includes a memory core having multiple memory bays, and each memory bay having multiple memory blocks. Although a memory core organization is disclosed where memory bays include memory blocks, and memory blocks include a group of memory cells, other organizations or groupings also can be used with the technology described herein.

Figure 1C:
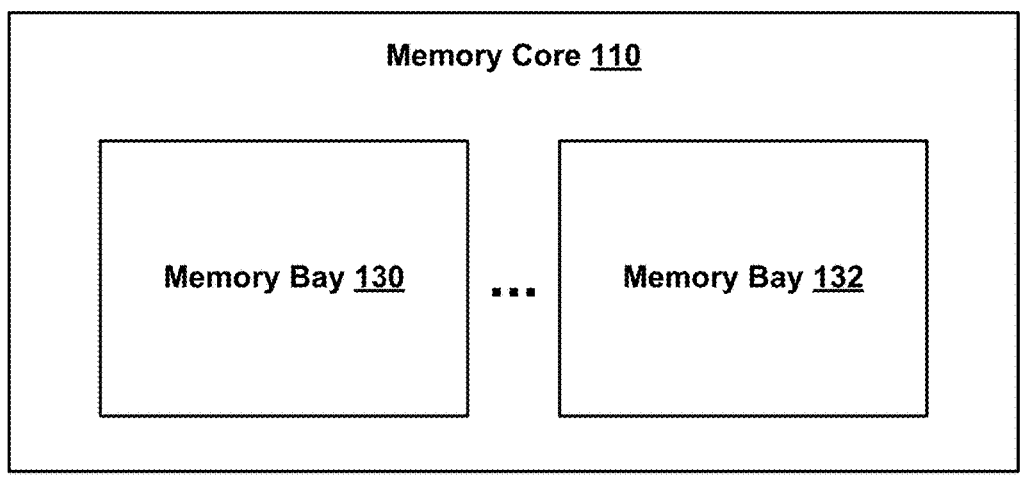
FIG. 1C depicts an embodiment of a memory core.

FIG. 1C depicts an embodiment of memory core 110 of FIG. 1A. As depicted, memory core 110 includes memory bay 130 and memory bay 132. In some embodiments, the number of memory bays per memory core can differ for different implementations. For example, a memory core may include only a single memory bay or multiple memory bays (e.g., 16 or other number of memory bays).

Figure 1D:
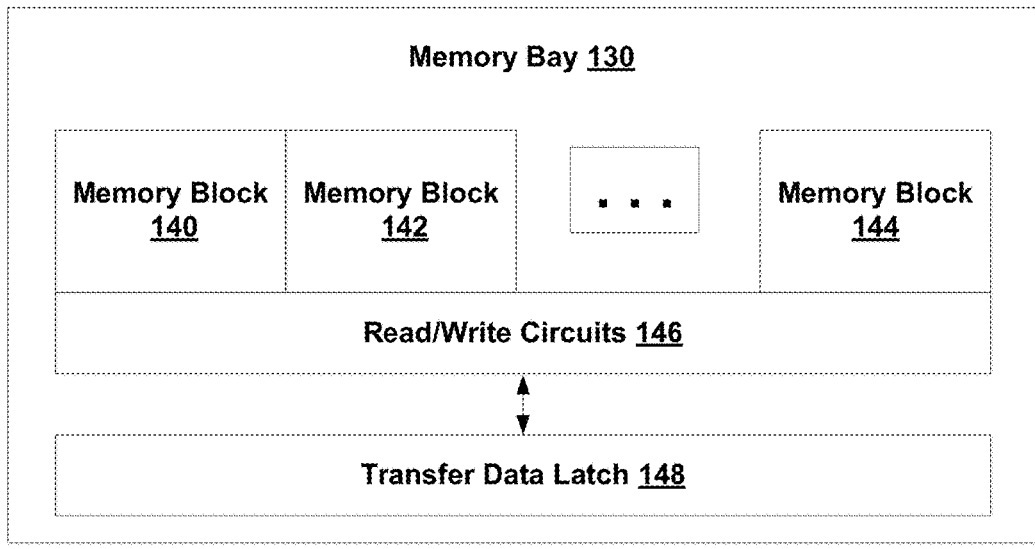
FIG. 1D depicts an embodiment of a memory bay.

FIG. 1D depicts an embodiment of memory bay 130 in FIG. 1C. As depicted, memory bay 130 includes memory blocks 140-144, read/write circuits 146 and a transfer data latch 148. In some embodiments, the number of memory blocks per memory bay may differ for different implementations. For example, a memory bay may include one or more memory blocks (e.g., 32 or other number of memory blocks per memory bay). Read/write circuits 146 include circuitry for reading and writing memory cells within memory blocks 140-144. In an embodiment, transfer data latch 148 is used for intermediate storage between memory chip controller 104 (FIG. 1A) and memory blocks 140, 142, . . . , 144.

In an embodiment, when host 102 instructs memory chip controller 104 to write data to memory chip 106, memory chip controller 104 writes host data to transfer data latch 148. Read/write circuits 146 then write data from transfer data latch 148 to a specified page in one of memory blocks 140, 142, . . . , 144. In an embodiment, transfer data latch 148 has a size equal to the size of a page. In an embodiment, when host 102 instructs memory chip controller 104 to read data from memory chip 106, read/write circuits 146 read from a specified page into transfer data latch 148, and memory chip controller 104 transfers the read data from transfer data latch 148 to host 102.

As depicted, read/write circuits 146 may be shared across multiple memory blocks within a memory bay. This allows chip area to be reduced because a single group of read/write circuits 146 may be used to support multiple memory blocks. However, in some embodiments, only a single memory block may be electrically coupled to read/write circuits 146 at a particular time to avoid signal conflicts.

In some embodiments, read/write circuits 146 may be used to write one or more pages of data into memory blocks 140-144 (or into a subset of the memory blocks). The memory cells within memory blocks 140-144 may permit direct over-writing of pages (i.e., data representing a page or a portion of a page may be written into memory blocks 140-144 without requiring an erase or reset operation to be performed on the memory cells prior to writing the data).

In one example, memory system 100 of FIG. 1A may receive a write command including a target address and a set of data to be written to the target address. Memory system 100 may perform a read-before-write (RBW) operation to read the data currently stored at the target address and/or to acquire overhead information (e.g., ECC information) before performing a write operation to write the set of data to the target address.

In some cases, read/write circuits 146 may be used to program a particular memory cell to be in one of three or more data/resistance states (i.e., the particular memory cell may include a multi-level memory cell). In one example, read/write circuits 146 may apply a first voltage difference (e.g., 2V) across the particular memory cell to program the particular memory cell into a first state of the three or more data/resistance states or a second voltage difference (e.g., 1V) across the particular memory cell that is less than the first voltage difference to program the particular memory cell into a second state of the three or more data/resistance states.

Applying a smaller voltage difference across the particular memory cell may cause the particular memory cell to be partially programmed or programmed at a slower rate than when applying a larger voltage difference. In another example, read/write circuits 146 may apply a first voltage difference across the particular memory cell for a first time period to program the particular memory cell into a first state of the three or more data/resistance states, and apply the first voltage difference across the particular memory cell for a second time period less than the first time period. One or more program pulses followed by a memory cell verification phase may be used to program the particular memory cell to be in the correct state.

Figure 1E:
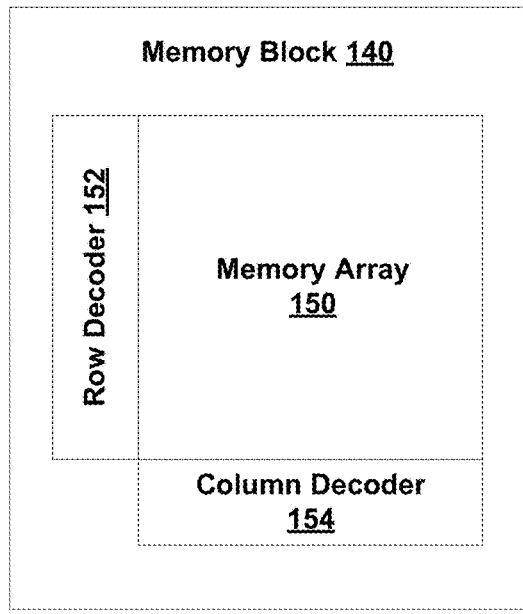
FIG. 1E depicts an embodiment of a memory block.

FIG. 1E depicts an embodiment of memory block 140 in FIG. 1D. As depicted, memory block 140 includes a memory array 150, a row decoder 152, and a column decoder 154. Memory array 150 may include a contiguous group of memory cells having contiguous word lines and bit lines. Memory array 150 may include one or more layers of memory cells. Memory array 150 may include a two-dimensional memory array or a three-dimensional memory array.

Row decoder 152 decodes a row address and selects a particular word line in memory array 150 when appropriate (e.g., when reading or writing memory cells in memory array 150). Column decoder 154 decodes a column address and selects one or more bit lines in memory array 150 to be electrically coupled to read/write circuits, such as read/write circuits 146 in FIG. 1D. In one embodiment, the number of word lines is 4K per memory layer, the number of bit lines is 1K per memory layer, and the number of memory layers is four, providing a memory array 150 containing 16M memory cells.

Figure 1F:
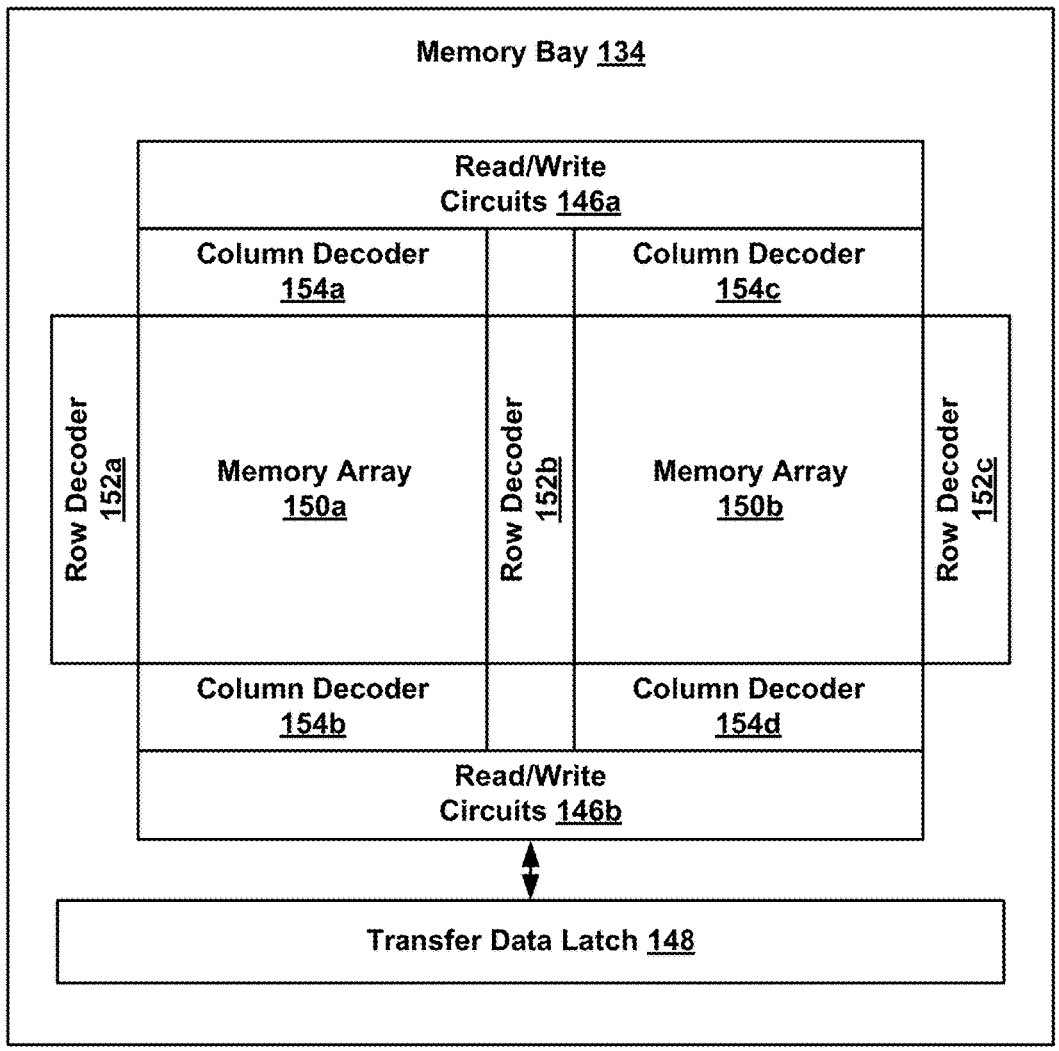
FIG. 1F depicts another embodiment of a memory bay.

FIG. 1F depicts an embodiment of a memory bay 134. Memory bay 134 is an alternative example implementation for memory bay 130 of FIG. 1D. In some embodiments, row decoders, column decoders, and read/write circuits may be split or shared between memory arrays. As depicted, row decoder 152*b* is shared between memory arrays 150*a* and 150*b* because row decoder 152*b* controls word lines in both memory arrays 150*a* and 150*b* (i.e., the word lines driven by row decoder 152*b* are shared).

Row decoders 152*a* and 152*b* may be split such that even word lines in memory array 150*a* are driven by row decoder 152*a* and odd word lines in memory array 150*a* are driven by row decoder 152b. Row decoders 152c and 152b may be split such that even word lines in memory array 150b are driven by row decoder 152c and odd word lines in memory array 150b are driven by row decoder 152b.

Column decoders 154a and 154b may be split such that even bit lines in memory array 150a are controlled by column decoder 154b and odd bit lines in memory array 150a are driven by column decoder 154a. Column decoders 154c and 154d may be split such that even bit lines in memory array 150b are controlled by column decoder 154d and odd bit lines in memory array 150b are driven by column decoder 154c.

The selected bit lines controlled by column decoder 154a and column decoder 154c may be electrically coupled to read/write circuits 146a. The selected bit lines controlled by column decoder 154b and column decoder 154d may be electrically coupled to read/write circuits 146b. Splitting the read/write circuits into read/write circuits 146a and 146b when the column decoders are split may allow for a more efficient layout of the memory bay.

Figure 1G:
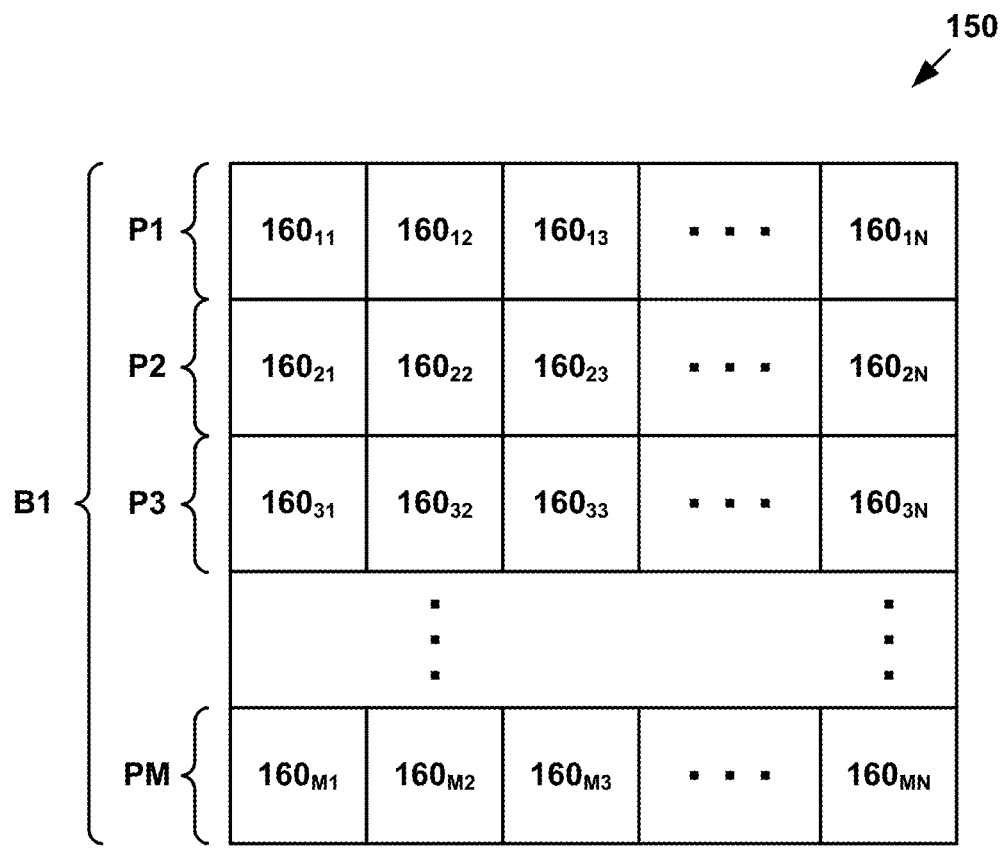
FIG. 1G depicts another embodiment of a memory block.

FIG. 1G depicts an embodiment of memory array 150 of FIG. 1E. Memory array 150 includes an M×N array of memory cells 160. In an embodiment, memory cells 160 in row of memory array 150 are grouped to form a page. For example, a first page P1 includes memory cells $160_{11}$, $160_{12}$, $160_{13}$, ..., $160_{1N}$, a second page P2 includes memory cells $160_{21}$, $160_{22}$, $160_{23}$, ..., $160_{2N}$, and so on. In an embodiment, a page is the smallest unit of writing in memory core 110. In an embodiment, pages P1, P2, P3, ..., PM of memory array 150 are grouped together to form a block. For example, block B1 includes pages P1, P2, P3, ..., PM. Block B1 is an example of memory blocks 140, 142, 144 of FIG. 1D. Other arrangements of memory cells, pages and blocks may be used. In an embodiment, memory cells 160 are reversible resistance-switching memory cells. In an embodiment, memory cells 160 are BMC memory cells.

Figure 2A:
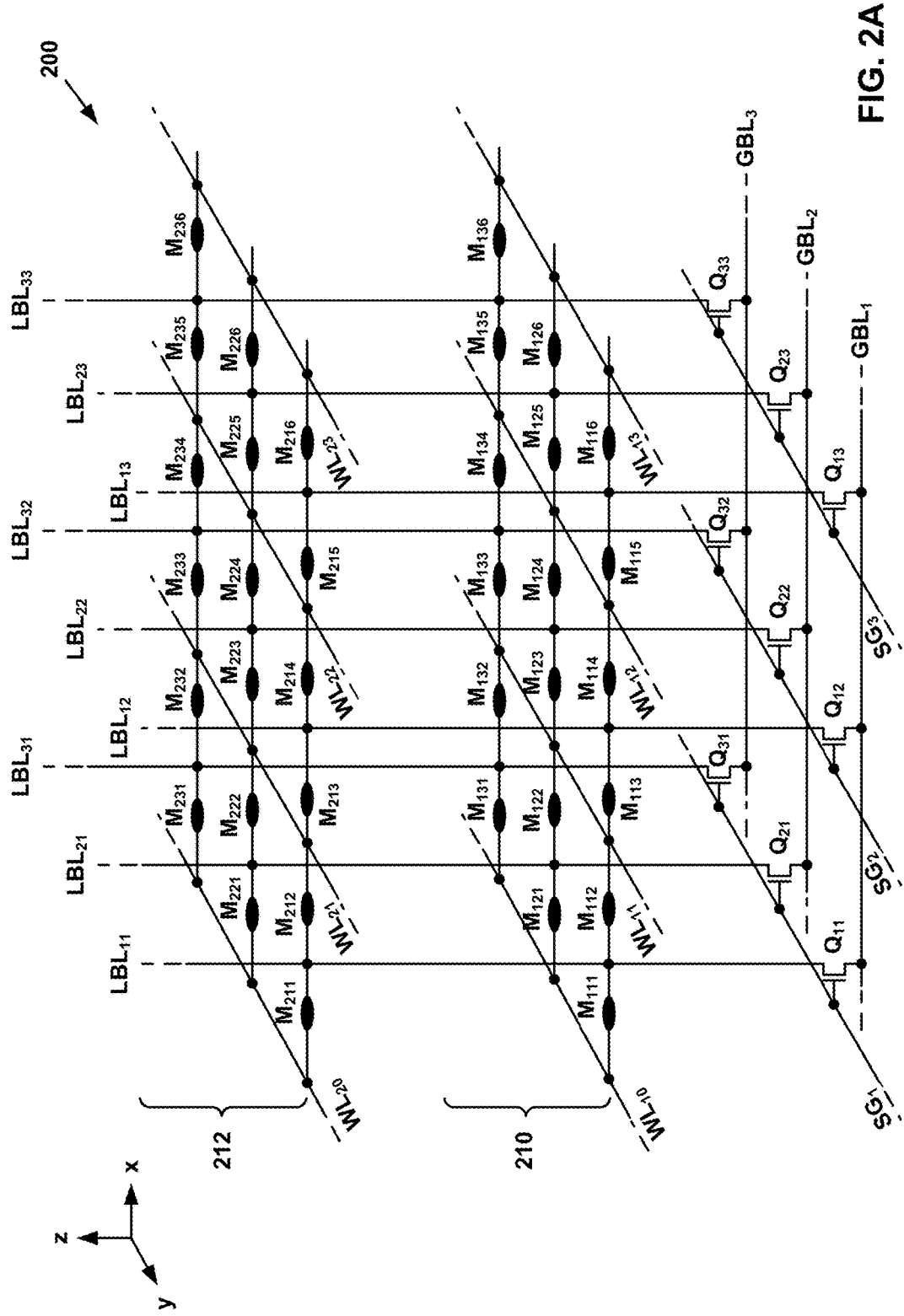
FIG. 2A depicts an embodiment of a portion of a monolithic three-dimensional memory array.

FIG. 2A depicts one embodiment of a portion of a monolithic three-dimensional memory array 200 that includes a first memory level 210, and a second memory level 212 positioned above first memory level 210. Monolithic three-dimensional memory array 200 is one example of an implementation for memory array 150 of FIG. 1E. Local bit lines $LBL_{11}$-$LBL_{33}$ are arranged in a first direction (e.g., a vertical or z-direction) and word lines $WL_{10}$-$WL_{23}$ are arranged in a second direction (e.g., an x-direction) perpendicular to the first direction. This arrangement of vertical bit lines in a monolithic three-dimensional memory array is one embodiment of a vertical bit line memory array.

As depicted, disposed between the intersection of each local bit line and each word line is a particular memory cell (e.g., memory cell $M_{111}$ is disposed between local bit line $LBL_{11}$ and word line $WL_{10}$). The particular memory cell may include a floating gate memory element, a charge trap memory element (e.g., using a silicon nitride material), a reversible resistance-switching memory element, or other similar device. The global bit lines $GBL_1$-$GBL_3$ are arranged in a third direction (e.g., a y-direction) that is perpendicular to both the first direction and the second direction.

Each local bit line $LBL_{11}$-$LBL_{33}$ has an associated bit line select transistor $Q_{11}$-$Q_{33}$, respectively. Bit line select transistors $Q_{11}$-$Q_{33}$ may be field effect transistors, such as shown, or may be any other transistors. As depicted, bit line select transistors $Q_{11}$-$Q_{31}$ are associated with local bit lines $LBL_{11}$-$LBL_{31}$, respectively, and may be used to connect local bit lines $LBL_{11}$-$LBL_{31}$ to global bit lines $GBL_1$-$GBL_3$, respectively, using row select line $SG_1$. In particular, each of bit line select transistors $Q_{11}$-$Q_{31}$ has a first terminal (e.g., a drain/source terminal) coupled to a corresponding one of local bit lines $LBL_{11}$-$LBL_{31}$, respectively, a second terminal (e.g., a source/drain terminal) coupled to a corresponding one of global bit lines $GBL_1$-$GBL_3$, respectively, and a third terminal (e.g., a gate terminal) coupled to row select line $SG_1$.

Similarly, bit line select transistors $Q_{12}$-$Q_{32}$ are associated with local bit lines $LBL_{12}$-$LBL_{32}$, respectively, and may be used to connect local bit lines $LBL_{12}$-$LBL_{32}$ to global bit lines $GBL_1$-$GBL_3$, respectively, using row select line $SG_2$. In particular, each of bit line select transistors $Q_{12}$-$Q_{32}$ has a first terminal (e.g., a drain/source terminal) coupled to a corresponding one of local bit lines $LBL_{12}$-$LBL_{32}$, respectively, a second terminal (e.g., a source/drain terminal) coupled to a corresponding one of global bit lines $GBL_1$-$GBL_3$, respectively, and a third terminal (e.g., a gate terminal) coupled to row select line $SG_2$.

Likewise, bit line select transistors $Q_{13}$-$Q_{33}$ are associated with local bit lines $LBL_{13}$-$LBL_{33}$, respectively, and may be used to connect local bit lines $LBL_{13}$-$LBL_{33}$ to global bit lines $GBL_1$-$GBL_3$, respectively, using row select line $SG_3$. In particular, each of bit line select transistors $Q_{13}$-$Q_{33}$ has a first terminal (e.g., a drain/source terminal) coupled to a corresponding one of local bit lines $LBL_{13}$-$LBL_{33}$, respectively, a second terminal (e.g., a source/drain terminal) coupled to a corresponding one of global bit lines $GBL_1$-$GBL_3$, respectively, and a third terminal (e.g., a gate terminal) coupled to row select line $SG_3$.

Because a single bit line select transistor is associated with a corresponding local bit line, the voltage of a particular global bit line may be selectively applied to a corresponding local bit line. Therefore, when a first set of local bit lines (e.g., $LBL_{11}$-$LBL_{31}$) is biased to global bit lines $GBL_1$-$GBL_3$, the other local bit lines (e.g., $LBL_{12}$-$LBL_{32}$ and $LBL_{13}$-$LBL_{33}$) must either also be driven to the same global bit lines $GBL_1$-$GBL_3$ or be floated.

In an embodiment, during a memory operation, all local bit lines within the memory array are first biased to an unselected bit line voltage by connecting each of the global bit lines to one or more local bit lines. After the local bit lines are biased to the unselected bit line voltage, then only a first set of local bit lines $LBL_{11}$-$LBL_{31}$ are biased to one or more selected bit line voltages via the global bit lines $GBL_1$-$GBL_3$, while the other local bit lines (e.g., $LBL_{12}$-$LBL_{32}$ and $LBL_{13}$-$LBL_{33}$) are floated. The one or more selected bit line voltages may correspond with, for example, one or more read voltages during a read operation or one or more programming voltages during a programming operation.

In an embodiment, a vertical bit line memory array, such as monolithic three-dimensional memory array 200, includes a greater number of memory cells along the word lines as compared with the number of memory cells along the vertical bit lines (e.g., the number of memory cells along a word line may be more than 10 times the number of memory cells along a bit line). In one example, the number of memory cells along each bit line may be 16 or 32, whereas the number of memory cells along each word line may be 2048 or more than 4096. Other numbers of memory cells along each bit line and along each word line may be used.

In an embodiment of a read operation, the data stored in a selected memory cell (e.g., memory cell $M_{111}$) may be read by biasing the word line connected to the selected memory cell (e.g., selected word line $WL_{10}$) to a selected word line voltage in read mode (e.g., 0V). The local bit line (e.g., $LBL_{11}$) coupled to the selected memory cell ($M_{111}$) is biased to a selected bit line voltage in read mode (e.g., 1 V) via the associated bit line select transistor (e.g., $Q_{11}$) coupled to the selected local bit line ($LBL_{11}$), and the global bit line (e.g., $GBL_1$) coupled to the bit line select transistor ($Q_{11}$). A sense amplifier may then be coupled to the selected local bit line ($LBL_{11}$) to determine a read current $I_{READ}$ of the selected memory cell ($M_{111}$). The read current $I_{READ}$ is conducted by the bit line select transistor $Q_{11}$, and may be between about 100 nA and about 500 nA, although other read currents may be used.

In an embodiment of a write operation, data may be written to a selected memory cell (e.g., memory cell $M_{221}$) by biasing the word line connected to the selected memory cell (e.g., $WL_{20}$) to a selected word line voltage in write mode (e.g., 5V). The local bit line (e.g., $LBL_{21}$) coupled to the selected memory cell ($M_{221}$) is biased to a selected bit line voltage in write mode (e.g., 0 V) via the associated bit line select transistor (e.g., $Q_{21}$) coupled to the selected local bit line ($LBL_{21}$), and the global bit line (e.g., $GBL_2$) coupled to the bit line select transistor ($Q_{21}$). During a write operation, a programming current $I_{PGRM}$ is conducted by the associated bit line select transistor $Q_{21}$, and may be between about 3 uA and about 6 uA, although other programming currents may be used.

During the write operation described above, the word line (e.g., $WL_{20}$) connected to the selected memory cell ($M_{221}$) may be referred to as a "selected word line," and the local bit line (e.g., $LBL_{21}$) coupled to the selected memory cell ($M_{221}$) may be referred to as the "selected local bit line." All other word lines coupled to unselected memory cells may be referred to as "unselected word lines," and all other local bit lines coupled to unselected memory cells may be referred to as "unselected local bit lines." For example, if memory cell $M_{221}$ is the only selected memory cell in monolithic three-dimensional memory array 200, word lines $WL_{10}$-$WL_{13}$ and $WL_{21}$-$WL_{23}$ are unselected word lines, and local bit lines $LBL_{11}$, $LBL_{31}$, $LBL_{12}$-$LBL_{32}$, and $LBL_{13}$-$LBL_{33}$ are unselected local bit lines.

Figure 2B:
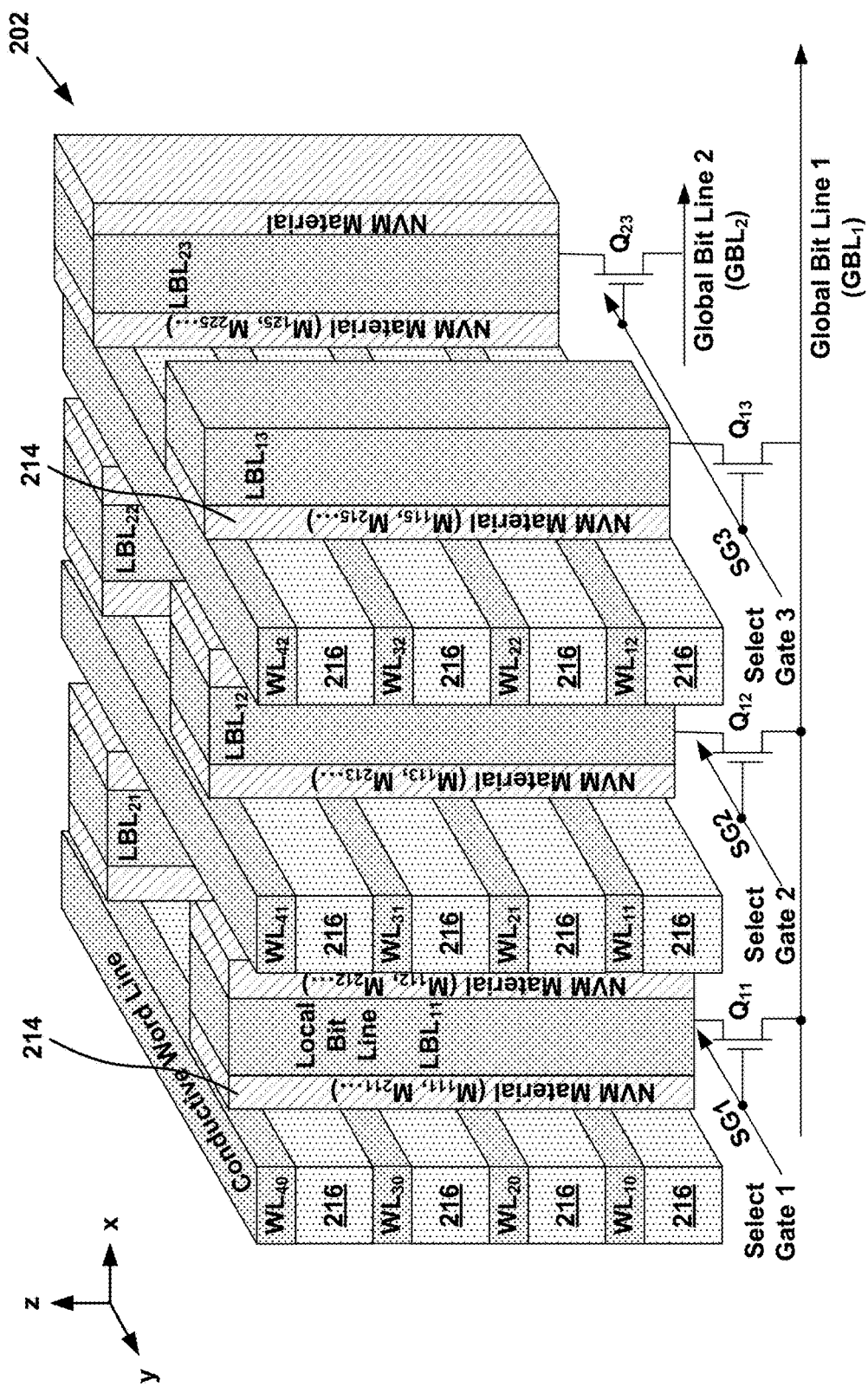
FIG. 2B depicts an embodiment of a portion of a monolithic three-dimensional memory array that includes vertical strips of a non-volatile memory material.

FIG. 2B depicts an embodiment of a portion of a monolithic three-dimensional memory array 202 that includes vertical strips of a non-volatile memory material. The portion of monolithic three-dimensional memory array 202 depicted in FIG. 2B may include an implementation for a portion of the monolithic three-dimensional memory array 200 depicted in FIG. 2A.

Monolithic three-dimensional memory array 202 includes word lines $WL_{10}$, $WL_{11}$, $WL_{12}$, . . . , $WL_{42}$ that are formed in a first direction (e.g., an x-direction), vertical bit lines $LBL_{11}$, $LBL_{12}$, $LBL_{13}$, . . . , $LBL_{23}$ that are formed in a second direction perpendicular to the first direction (e.g., a z-direction), and non-volatile memory material 214 formed in the second direction (e.g., the z-direction). A spacer 216 made of a dielectric material (e.g., silicon dioxide, silicon nitride, or other dielectric material) is disposed between adjacent word lines $WL_{10}$, $WL_{11}$, $WL_{12}$, . . . , $WL_{42}$.

Each non-volatile memory material 214 may include, for example, an oxide material, a reversible resistance-switching memory material (e.g., one or more metal oxide layers such as nickel oxide, hafnium oxide, or other similar metal oxide materials, a phase change material, a barrier modulated switching structure or other similar reversible resistance-switching memory material), a ferroelectric material, or other non-volatile memory material.

Each non-volatile memory material 214 may include a single material layer or multiple material layers. In an embodiment, each non-volatile memory material 214 includes a barrier modulated switching structure. Example barrier modulated switching structures include a semiconductor material layer (e.g., an amorphous silicon layer) adjacent a conductive oxide material layer (e.g., a titanium oxide layer). Other example barrier modulated switching structures include a thin (e.g., less than about 2 nm) barrier oxide material (e.g., an aluminum oxide layer) disposed between a semiconductor material layer (e.g., an amorphous silicon layer) and a conductive oxide material layer (e.g., a titanium oxide layer). Still other example barrier modulated switching structures include a barrier oxide material (e.g., an aluminum oxide layer) disposed adjacent a conductive oxide material layer (e.g., a titanium oxide layer), with no semiconductor material layer (e.g., amorphous silicon) in the barrier modulated switching structure. Such multi-layer embodiments may be used to form BMC memory elements.

In an embodiment, each non-volatile memory material 214 may include a single continuous layer of material that may be used by a plurality of memory cells or devices. In an embodiment, each memory cell includes a portion of non-volatile memory material 214 disposed between a first conductor (e.g., a word line) and a second conductor (e.g., a bit line).

In an embodiment, portions of the non-volatile memory material 214 may include a part of a first memory cell associated with the cross section between $WL_{12}$ and $LBL_{13}$ and a part of a second memory cell associated with the cross section between $WL_{22}$ and $LBL_{13}$. In some cases, a vertical bit line, such as $LBL_{13}$, may include a vertical structure (e.g., a rectangular prism, a cylinder, or a pillar) and the non-volatile material may completely or partially surround the vertical structure (e.g., a conformal layer of phase change material surrounding the sides of the vertical structure).

As depicted, each of the vertical bit lines $LBL_{11}$, $LBL_{12}$, $LBL_{13}$, . . . , $LBL_{23}$ may be connected to one of a set of global bit lines via an associated vertically-oriented bit line select transistor (e.g., $Q_{11}$, $Q_{12}$, $Q_{13}$, $Q_{23}$). Each vertically-oriented bit line select transistor may include a MOS device (e.g., an NMOS device) or a vertical thin-film transistor (TFT).

In an embodiment, each vertically-oriented bit line select transistor is a vertically-oriented pillar-shaped TFT coupled between an associated local bit line pillar and a global bit line. In an embodiment, the vertically-oriented bit line select transistors are formed in a pillar select layer formed above a CMOS substrate, and a memory layer that includes multiple layers of word lines and memory elements is formed above the pillar select layer.

FIGS. 3A-3F depict various views of an embodiment of a portion of a monolithic three-dimensional memory array 300 that includes vertical strips of a non-volatile memory material. The physical structure depicted in FIGS. 3A-3F may include one implementation for a portion of the monolithic three-dimensional memory array depicted in FIG. 2B.

Monolithic three-dimensional memory array 300 includes vertical bit lines $LBL_{11}$-$LBL_{33}$ arranged in a first direction (e.g., a z-direction), word lines $WL_{10}$, $WL_{11}$, . . . , $WL_{53}$ arranged in a second direction (e.g., an x-direction) perpendicular to the first direction, and row select lines $SG_1$, $SG_2$, $SG_3$ arranged in the second direction, and global bit lines $GBL_1$, $GBL_2$, $GBL_3$ arranged in a third direction (e.g., a y-direction) perpendicular to the first and second directions.

Vertical bit lines $LBL_{11}$-$LBL_{33}$ are disposed above global bit lines $GBL_1$, $GBL_2$, $GBL_3$, which each have a long axis in the second (e.g., x-direction). Person of ordinary skill in the art will understand that monolithic three-dimensional memory arrays, such as monolithic three-dimensional memory array 300 may include more or fewer than twenty word lines, three row select lines, three global bit lines, and nine vertical bit lines.

In an embodiment, global bit lines $GBL_1$, $GBL_2$, $GBL_3$ are disposed above a substrate 302, such as a silicon, germanium, silicon-germanium, undoped, doped, bulk, silicon-on-insulator ("SOI") or other substrate with or without additional circuitry. In an embodiment, an isolation layer 304, such as a layer of silicon dioxide, silicon nitride, silicon oxynitride or any other suitable insulating layer, is formed above substrate 302.

In an embodiment, a first dielectric material layer 308 (e.g., silicon dioxide) and a second dielectric material layer 310 (e.g., silicon dioxide) are formed above isolation layer 304. Global bit lines $GBL_1$, $GBL_2$, $GBL_3$ include a conductive material layer 306 (e.g., tungsten) and are disposed above isolation layer 304 and are separated from one another by first dielectric material layer 308.

Vertically-oriented bit line select transistors $Q_{11}$-$Q_{33}$ are disposed above global bit lines $GBL_1$, $GBL_2$, $GBL_3$ and are separated from one another by second dielectric material layer 310. Vertically-oriented bit line select transistors $Q_{11}$-$Q_{13}$ are disposed above and electrically coupled to global bit line $GBL_1$, vertically-oriented bit line select transistors $Q_{21}$-$Q_{23}$ are disposed above and electrically coupled to global bit line $GBL_2$, and vertically-oriented bit line select transistors $Q_{31}$-$Q_{33}$ are disposed above and electrically coupled to global bit line $GBL_3$.

Vertically-oriented bit line select transistors $Q_{11}$-$Q_{33}$ may be field effect transistors, although other transistors types may be used. In an embodiment, each of vertically-oriented bit line select transistors $Q_{31}$-$Q_{33}$ has a height between about 150 nm and about 500 nm. Other height values may be used.

Each of vertically-oriented bit line select transistors $Q_{11}$-$Q_{33}$ has a first terminal 312a (e.g., a drain/source terminal), a second terminal 312b (e.g., a source/drain terminal), a first control terminal 312c1 (e.g., a first gate terminal) and a second control terminal 312c2 (e.g., a second gate terminal). First gate terminal 312c1 and second gate terminal 312c2 may be disposed on opposite sides of the vertically-oriented bit line select transistor. A gate dielectric material 314 (e.g., $SiO_2$) is disposed between first gate terminal 312c1 and first terminal 312a and second terminal 312b, and also is disposed between second gate terminal 312c2 and first terminal 312a and second terminal 312b.

First gate terminal 312c1 may be used to selectively induce a first electrically conductive channel between first terminal 312a and second terminal 312b of the transistor, and second gate terminal 312c2 may be used to selectively induce a second electrically conductive channel between first terminal 312a and second terminal 312b of the transistor. In an embodiment, first gate terminal 312c1 and second gate terminal 312c2 are coupled together to form a single control terminal 312c that may be used to collectively turn ON and OFF the vertically-oriented bit line select transistor.

Row select lines $SG_1$, $SG_2$, $SG_3$ are disposed above global bit lines $GBL_1$, $GBL_2$ and $GBL_3$, and form gate terminals 312c of vertically-oriented bit line select transistors $Q_{11}$-$Q_{33}$. In particular, row select line $SG_1$ forms the gate terminals of vertically-oriented bit line select transistors $Q_{11}$, $Q_{21}$ and $Q_{31}$, row select line $SG_2$ forms the gate terminals of vertically-oriented bit line select transistors $Q_{12}$, $Q_{22}$ and $Q_{32}$, and row select line $SG_3$ forms the gate terminals of vertically-oriented bit line select transistors $Q_{13}$, $Q_{23}$ and $Q_{33}$.

A first etch stop layer 316 (e.g., aluminum oxide) is disposed above second dielectric material layer 310. A stack of word lines $WL_{10}$, $WL_{11}$, ..., $WL_{53}$ is disposed above first etch stop layer 316, with a third dielectric material layer 318 (e.g., silicon dioxide) separating adjacent word lines. A second etch stop layer 320 (e.g., polysilicon) may be formed above the stack of word lines $WL_{10}$, $WL_{11}$, ..., $WL_{53}$. Each of word lines $WL_{10}$, $WL_{11}$, ..., $WL_{53}$ includes a conductive material layer (e.g., titanium nitride, tungsten, tantalum nitride or other similar electrically conductive material, or combination thereof).

In an embodiment, non-volatile memory material 214 is disposed adjacent word lines $WL_{10}$, $WL_{11}$, ..., $WL_{53}$. Non-volatile memory material 214 may include, for example, an oxide layer, a reversible resistance-switching material (e.g., one or more metal oxide layers such as nickel oxide, hafnium oxide, or other similar metal oxide materials, a phase change material, a barrier modulated switching structure or other similar reversible resistance-switching memory material), a ferroelectric material, or other non-volatile memory material.

Non-volatile memory material 214 may include a single continuous layer of material that may be used by a plurality of memory cells or devices. For simplicity, non-volatile memory material 214 also will be referred to in the remaining discussion as reversible resistance-switching memory material 214.

Reversible resistance-switching memory material 214 may include a single material layer or multiple material layers. In an embodiment, reversible resistance-switching memory material 214 includes a barrier modulated switching structure. In some embodiments, barrier modulated switching structures include a semiconductor material layer (e.g., amorphous silicon) and a conductive oxide material layer (e.g., titanium oxide). In some embodiments, barrier modulated switching structures include a thin (e.g., less than about 2 nm) barrier oxide material disposed between a semiconductor material layer and a conductive oxide material layer.

In an embodiment, reversible resistance-switching memory material 214 includes a barrier modulated switching structure that includes a semiconductor material layer 322 and a conductive oxide material layer 324. In an embodiment, semiconductor material layers 322 are disposed adjacent word lines $WL_{10}$, $WL_{11}$, ..., $WL_{53}$, and conductive oxide material layers 324 are disposed adjacent vertical bit line $LBL_{11}$-$LBL_{33}$. In an embodiment, an adhesion material layer (not shown) may be disposed between semiconductor material layers 322 and adjacent word lines $WL_{10}$, $WL_{11}$, ..., $WL_{53}$.

In embodiments, semiconductor material layer 322 has a thickness between about 3 nm and about 15 nm, and includes one or more of carbon, germanium, silicon, tantalum nitride, tantalum silicon nitride, or other similar semiconductor material. In embodiments, conductive oxide material layer 324 has a thickness between about 5 nm and about 25 nm, and includes one or more of aluminum-doped zinc oxide, aluminum-doped zirconium oxide, cerium oxide, indium tin oxide, niobium-doped strontium titanate, praseodymium calcium manganese oxide, titanium oxide, tungsten oxide, zinc oxide, or other similar conductive oxide material. Other semiconductor materials, conductive oxide materials, and thicknesses may be used.

In embodiments, each of semiconductor material layer 322, and conductive oxide material layer 324 may be amorphous, polycrystalline, nano-crystalline, or single crytalline, and each may be formed by chemical vapor deposition (CVD), physical vapor deposition (PVD), atomic layer deposition (ALD), atomic layer deposition nanolaminates, or other method.

Vertical bit lines $LBL_{11}$-$LBL_{33}$ are disposed adjacent reversible resistance-switching memory material 214, and are formed of a conductive material (e.g., titanium nitride). Vertical bit lines $LBL_{11}$-$LBL_{33}$ are separated from one another by a fourth dielectric material layer 328 (e.g., silicon dioxide). In some embodiments, each of vertical bit lines $LBL_{11}$-$LBL_{33}$ includes a vertical structure (e.g., a rectangular prism, a cylinder, or a pillar), and the vertical strip of reversible resistance-switching memory material 214 may completely or partially surround the vertical structure (e.g., a conformal layer of reversible resistance-switching material surrounding the sides of the vertical structure).

A memory cell is disposed between the intersection of each vertical bit line and each word line. In an embodiment, each memory cell includes a portion of reversible resistance-switching memory material 214 disposed between a first conductor (e.g., one of word lines $WL_{10}$, $WL_{11}$, ..., $WL_{53}$) and a second conductor (e.g., one of bit lines $LBL_{11}$-$LBL_{33}$).

For example, a memory cell $M_{111}$ is disposed between vertical bit line $LBL_{11}$ and word line $WL_{10}$, a memory cell $M_{116}$ is disposed between vertical bit line $LBL_{13}$ and word line $WL_{13}$, a memory cell $M_{511}$ is disposed between vertical bit line $LBL_{11}$ and word line $WL_{50}$, a memory cell $M_{536}$ is disposed between vertical bit line $LBL_{33}$ and word line $WL_{50}$, and so on. In an embodiment, monolithic three-dimensional memory array 300 includes ninety memory cells $M_{111}$, $M_{112}$, ..., $M_{536}$. Persons of ordinary skill in the art will understand that monolithic three-dimensional memory arrays may include more or fewer than ninety memory cells.

In an embodiment, portions of the reversible resistance-switching memory material 214 may include a part of memory cell $M_{111}$ associated with the cross section between word line $WL_{10}$ and $LBL_{11}$, and a part of memory cell $M_{211}$ associated with the cross section between word line $WL_{20}$ and $LBL_{11}$, and so on.

Figure 3A:
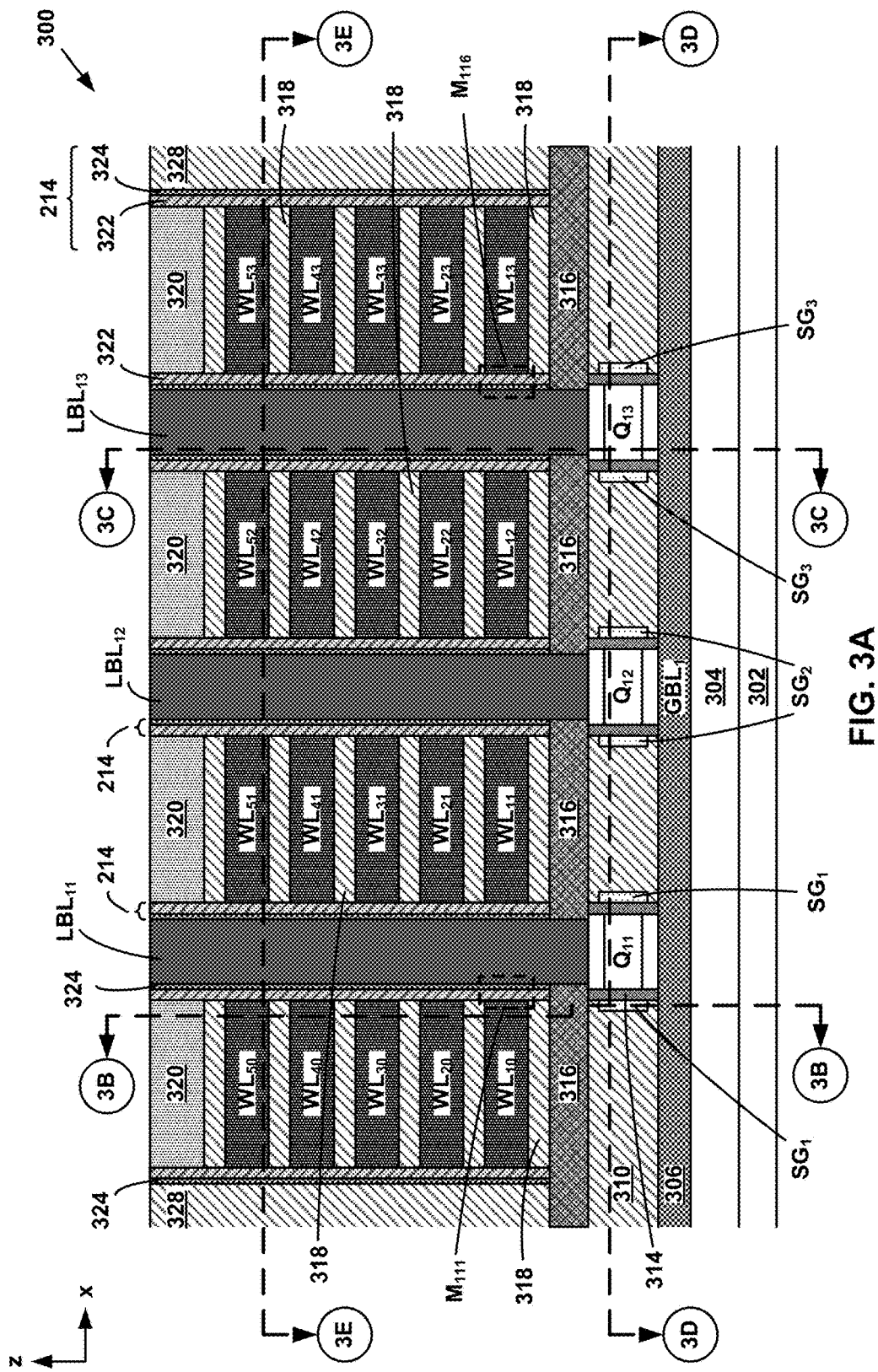
Figure 3B:
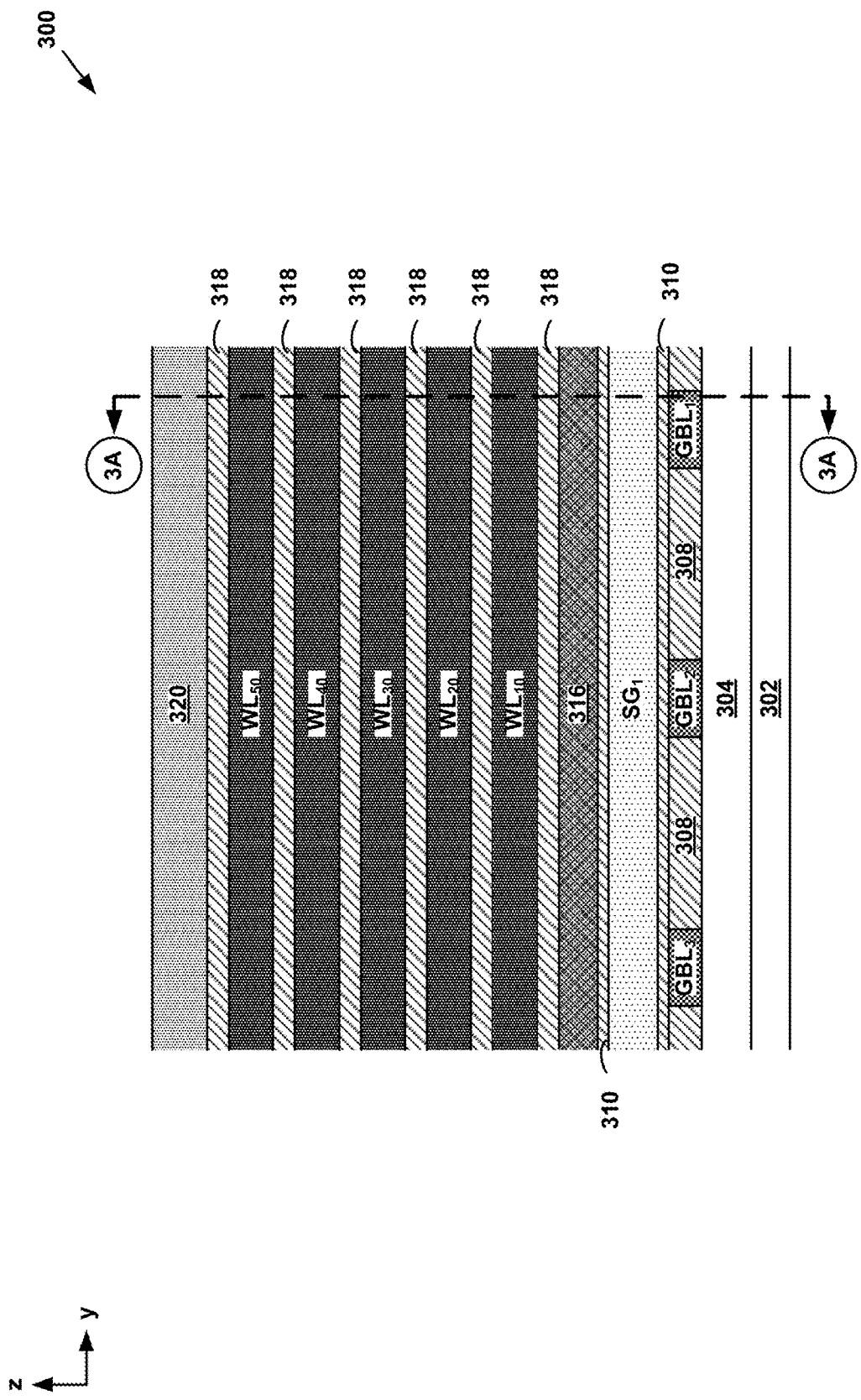
Figure 3E:
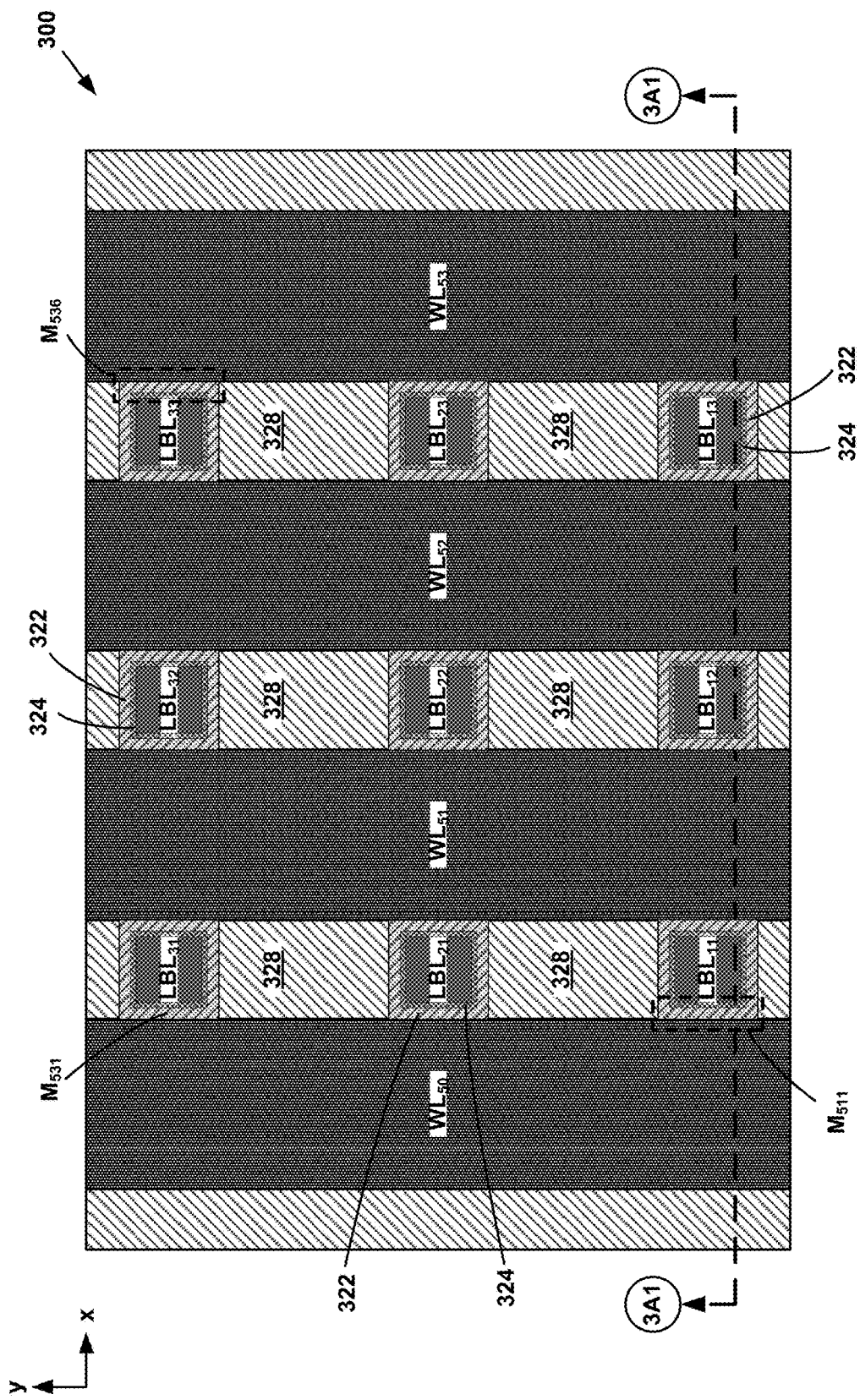
Figure 3F:
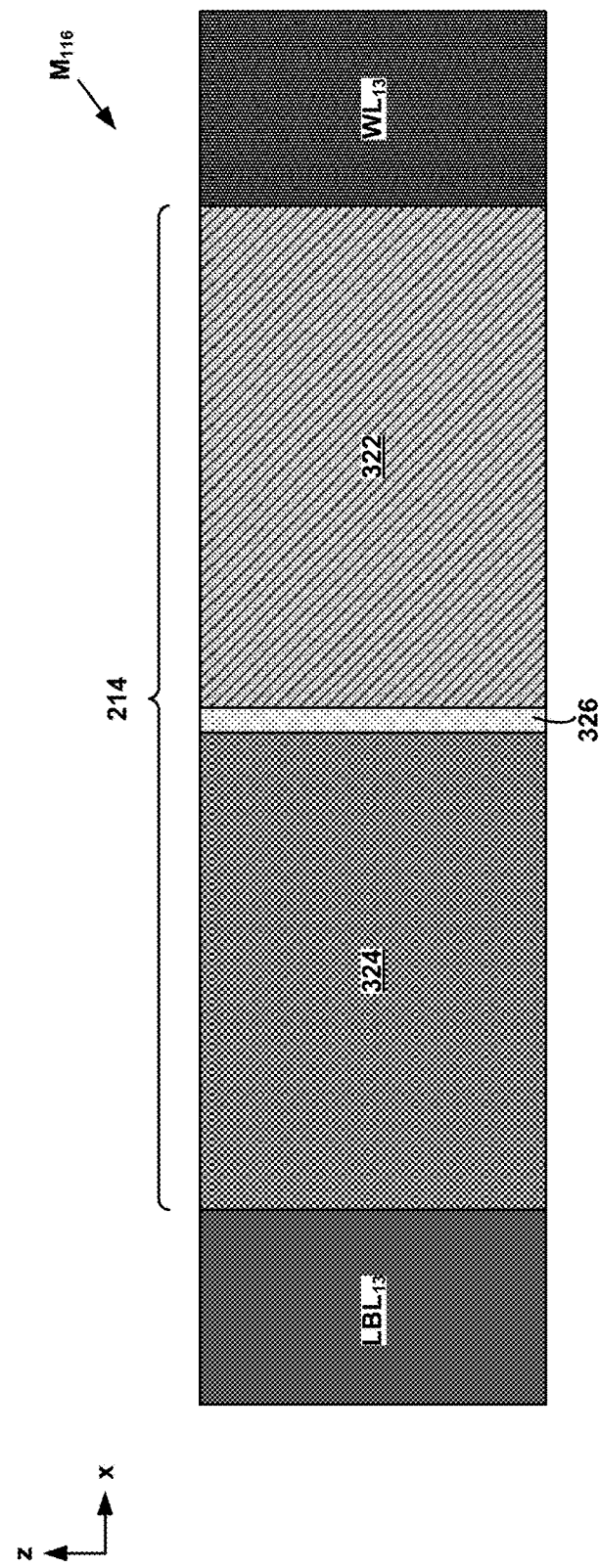

Each of memory cells $M_{111}$, $M_{112}$, ..., $M_{536}$ may include a floating gate device, a charge trap device (e.g., using a silicon nitride material), a resistive change memory device, or other type of memory device. In an embodiment, each of memory cells $M_{111}$, $M_{112}$, ..., $M_{536}$ is a BMC memory cell that includes a barrier modulated switching structure. FIG. 3F depicts an embodiment of a BMC memory cell $M_{116}$ that includes a reversible resistance-switching memory material 214 disposed between a first conductor (word line $WL_{13}$) and a second conductor (local bit line $LBL_{13}$).

In an embodiment, each reversible resistance-switching memory material 214 is a barrier modulated switching structure that includes a reactive layer 326 between semiconductor material layer 322 and conductive oxide material layer 324. In embodiments, reactive layer 326 may have a thickness between about 1 nm and about 10 nm, and forms as a result of semiconductor material layer 322 reacting with oxygen from conductive oxide material layer 324.

For example, if semiconductor material layer 322 includes amorphous silicon, and conductive oxide material layer 324 includes yttria-stabilized zirconia, reactive layer 326 includes silicon dioxide (a reaction of amorphous silicon from semiconductor material layer 322 with oxygen from the yttria-stabilized zirconia conductive oxide material layer 324). Other similar reactive layers 326 may be formed from a reaction of semiconductor material layer 322 with oxygen in conductive oxide material layer 324. In other embodiments, reactive layer 326 may be a deposited material layer.

Vertically-oriented bit line select transistors $Q_{11}$-$Q_{33}$ may be used to select a corresponding one of vertical bit lines $LBL_{11}$-$LBL_{33}$. Vertically-oriented bit line select transistors $Q_{11}$-$Q_{33}$ may be field effect transistors, although other transistors types may be used.

Thus, the first gate terminal and the second gate terminal of each of vertically-oriented bit line select transistors $Q_{11}$-$Q_{33}$ may be used to turn ON and OFF vertically-oriented bit line select transistors $Q_{11}$-$Q_3$. Without wanting to be bound by any particular theory, for each of vertically-oriented bit line select transistors $Q_{11}$-$Q_{33}$, it is believed that the current drive capability of the transistor may be increased by using both the first gate terminal and the second gate terminal to turn ON the transistor. For simplicity, the first and second gate terminal of each of select transistors $Q_{11}$-$Q_{33}$ will be referred to as a single gate terminal.

Vertically-oriented bit line select transistors $Q_{11}$, $Q_{12}$, $Q_{13}$ are used to selectively connect/disconnect vertical bit lines $LBL_{11}$, $LBL_{12}$, and $LBL_{13}$ to/from global bit line $GBL_1$ using row select lines $SG_1$, $SG_2$, $SG_3$, respectively. In particular, each of vertically-oriented bit line select transistors $Q_{11}$, $Q_{12}$, $Q_{13}$ has a first terminal (e.g., a drain./source terminal) coupled to a corresponding one of vertical bit lines $LBL_{11}$, $LBL_{12}$, and $LBL_{13}$, respectively, a second terminal (e.g., a source/drain terminal) coupled to global bit line $GBL_1$, and a control terminal (e.g., a gate terminal) coupled to row select line $SG_1$, $SG_2$, $SG_3$, respectively.

Row select lines $SG_1$, $SG_2$, $SG_3$ are used to turn ON/OFF vertically-oriented bit line select transistors $Q_{11}$, $Q_{12}$, $Q_{13}$, respectively, to connect/disconnect vertical bit lines $LBL_{11}$, $LBL_{12}$, and $LBL_{13}$, respectively, to/from global bit line $GBL_1$.

Likewise, vertically-oriented bit line select transistors $Q_{11}$, $Q_{21}$, ..., $Q_{33}$ are used to selectively connect/disconnect vertical bit lines $LBL_{11}$, $LBL_{21}$, and $LBL_{31}$, respectively, to global bit lines $GBL_1$, $GBL_2$, $GBL_3$, respectively, using row select line $SG_1$. In particular, each of vertically-oriented bit line select transistors $Q_{11}$, $Q_{21}$, $Q_{31}$ has a first terminal (e.g., a drain./source terminal) coupled to a corresponding one of vertical bit lines $LBL_{11}$, $LBL_{21}$, and $LBL_{31}$, respectively, a second terminal (e.g., a source/drain terminal) coupled to a corresponding one of global bit lines $GBL_1$, $GBL_2$, $GBL_3$, respectively, and a control terminal (e.g., a gate terminal) coupled to row select line $SG_1$. Row select line $SG_1$ is used to turn ON/OFF vertically-oriented bit line select transistors $Q_{11}$, $Q_{21}$, $Q_{31}$ to connect/disconnect vertical bit lines $LBL_{11}$, $LBL_{21}$, and $LBL_{31}$, respectively, to/from global bit lines $GBL_1$, $GBL_2$, $GBL_3$, respectively.

Similarly, vertically-oriented bit line select transistors $Q_{13}$, $Q_{23}$, $Q_{33}$ are used to selectively connect/disconnect vertical bit lines $LBL_{13}$, $LBL_{23}$, and $LBL_{33}$, respectivelyto/from global bit lines $GBL_1$, $GBL_2$, $GBL_3$, respectively, using row select line $SG_3$. In particular, each of vertically-oriented bit line select transistors $Q_{13}$, $Q_{23}$, $Q_{33}$ has a first terminal (e.g., a drain./source terminal) coupled to a corresponding one of vertical bit lines $LBL_{13}$, $LBL_{23}$, and $LBL_{33}$, respectively, a second terminal (e.g., a source/drain terminal) coupled to a corresponding one of global bit lines $GBL_1$, $GBL_2$, $GBL_3$, respectively, and a control terminal (e.g., a gate terminal) coupled to row select line $SG_3$. Row select line $SG_3$ is used to turn ON/OFF vertically-oriented bit line select transistors $Q_{13}$, $Q_{23}$, $Q_{33}$ to connect/disconnect vertical bit lines $LBL_{13}$, $LBL_{23}$, and $LBL_{33}$, respectively, to/from global bit lines $GBL_1$, $GBL_2$, $GBL_3$, respectively.

As described above, in an embodiment, each of memory cells $M_{111}$, $M_{112}$, ..., $M_{536}$ is a BMC memory cell that includes a barrier modulated switching structure, and FIG. 3F depicts an embodiment of one such BMC memory cell $M_{116}$ that includes a reversible resistance-switching memory material 214 disposed between a first conductor (e.g., word line $WL_{13}$) and a second conductor (e.g., local bit line $LBL_{13}$). In an embodiment, reversible resistance-switching memory material 214 includes a reactive layer 326 between semiconductor material layer 322 and conductive oxide material layer 324.

Without wanting to be bound by any particular theory, it is believed that the resistance-switching effect in BMC memory cells predominantly occurs as a result of creation and movement of oxygen vacancies between different material layers in the BMC memory cells, which causes the BMC memory cell to reversibly switch between two or more resistance states (e.g., a low resistance "SET" state and a high resistance "RESET" state). For example, referring to BMC memory cell $M_{116}$ of FIG. 3F, it is believed that the resistance-switching effect predominantly occurs as a result of creation and movement of oxygen vacancies between conductive oxide material layer 324 and reactive layer 326.

Such resistance-switching occurs by virtue of applying voltage pulses of the appropriate polarity between the first conductor (e.g., word line $WL_{13}$) and the second conductor (e.g., local bit line $LBL_{13}$) of the BMC memory cell. As used herein, such a resistance-switching mechanism is referred to as a "bulk switching" mode of operation. BMC memory cells may be reversibly switched between resistance states for numerous program and erase (P/E) cycles.

However, without wanting to be bound by any particular theory, it is believed that after some number of P/E cycles, the resistance-switching mechanism of BMC memory cells no longer predominantly occurs as a result of bulk switching, but instead begins to occur as a result of creation and destruction of conductive filaments between the first conductor (e.g., word line $WL_{13}$ in FIG. 3F) and the second conductor (e.g., local bit line $LBL_{13}$ in FIG. 3F) of the memory cell. As used herein, such a resistance-switching mechanism is referred to as a "filamentary switching" mode of operation.

Figure 4:
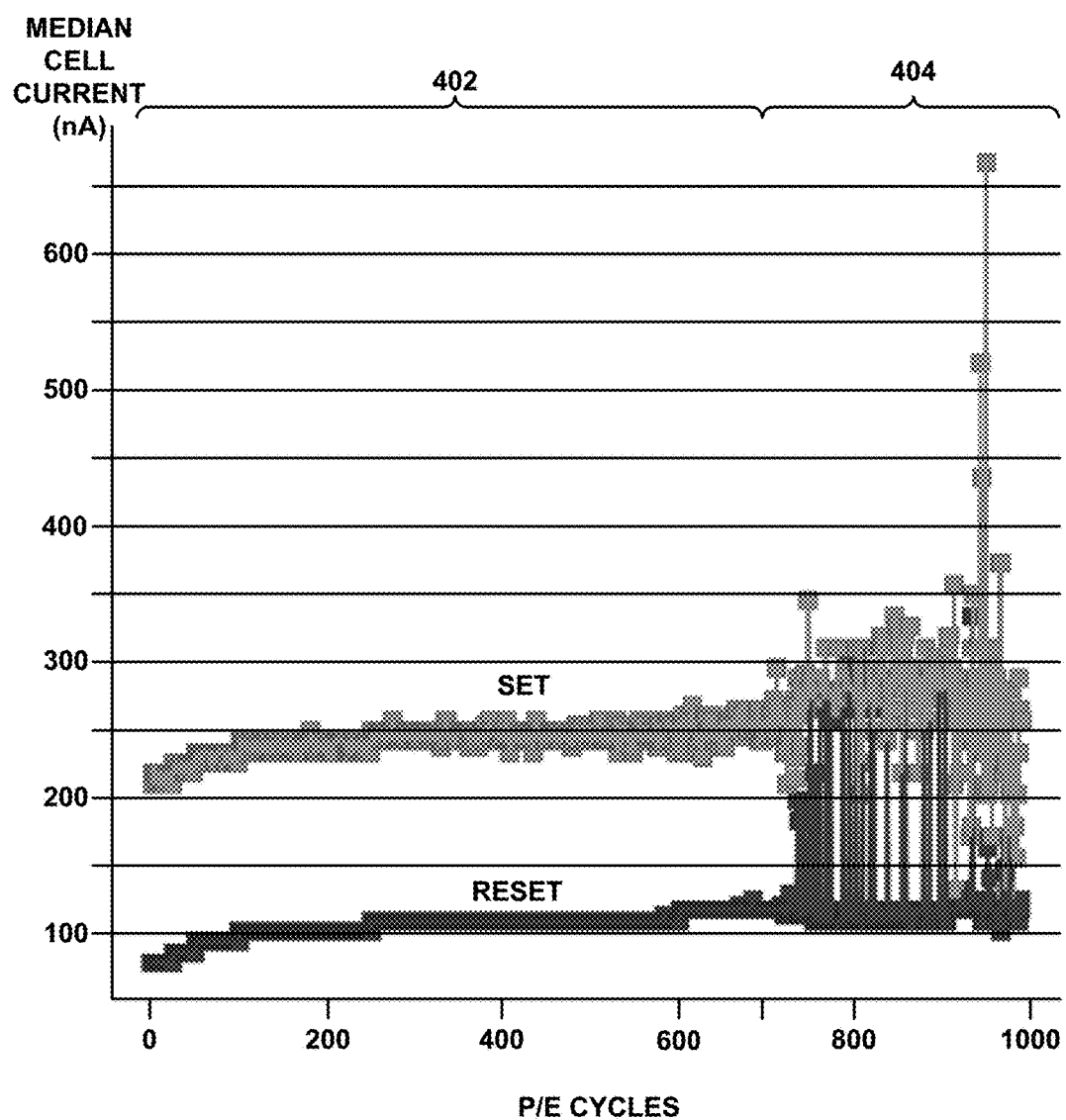
FIG. 4 depicts electrical characteristics of an embodiment of a population of memory cells.

FIG. 4 illustrates example electrical characteristics (median cell current versus P/E cycle) of a population of BMC memory cells. The diagram illustrates a first region of operation 402 from 0 to about 700 P/E cycles, and a second region of operation 404 of greater that about 700 P/E cycles. In first region of operation 402 the cell currents in SET and RESET states are tightly distributed over relatively narrow ranges of current. Without wanting to be bound by any particular theory, it is believed that in first region of operation 402, the BMC memory cells predominantly exhibit bulk switching behavior. In second region of operation 404 the variation in cell current substantially increases. Without wanting to be bound by any particular theory, it is believed that in second region of operation 404, the BMC memory cells exhibit predominantly filamentary switching behavior.

In an embodiment, first region of operation 402 (bulk switching) is more desirable than second region of operation 404 (filamentary switching). In particular, on a P/E cycle-by-cycle basis, it is believed that BMC memory cell current is more predictable and repeatable, and the memory cell switching behavior is more deterministic in first region of operation 402 than second region of operation 404.

In an embodiment, BMC memory cells are operated in first region of operation 402, but are deemed to be "bad" memory cells and are "retired" from further use for host data storage at a point before the cells begins operating in second region of operation 404. In an embodiment, retired BMC memory cells are deemed to be at an end-of-life (EOL), and are no longer used for host data storage.

Figure 5A:
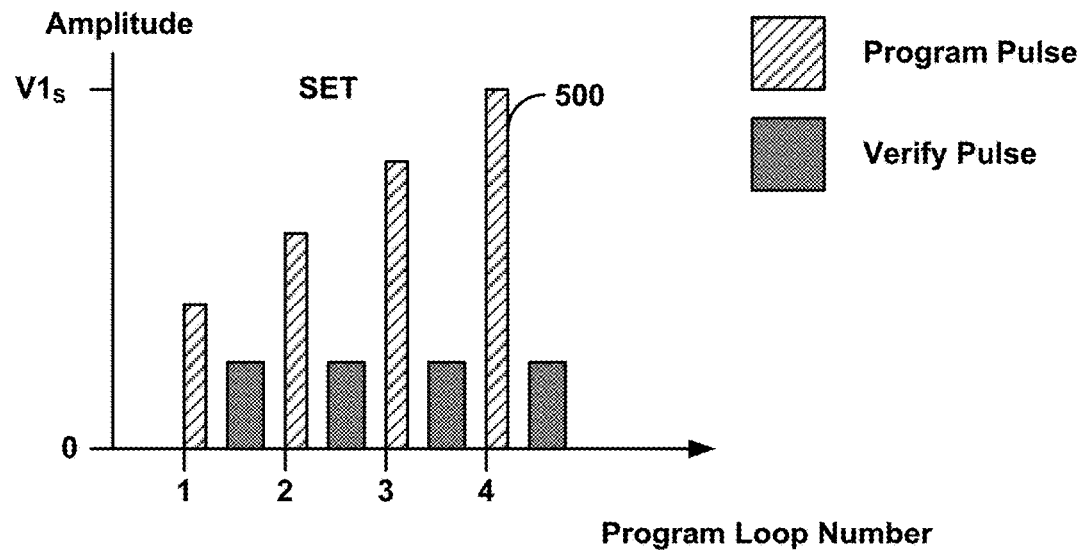
FIGS. 5A-5B depict embodiments of programming sequences for programming memory cells.
Figure 5B:
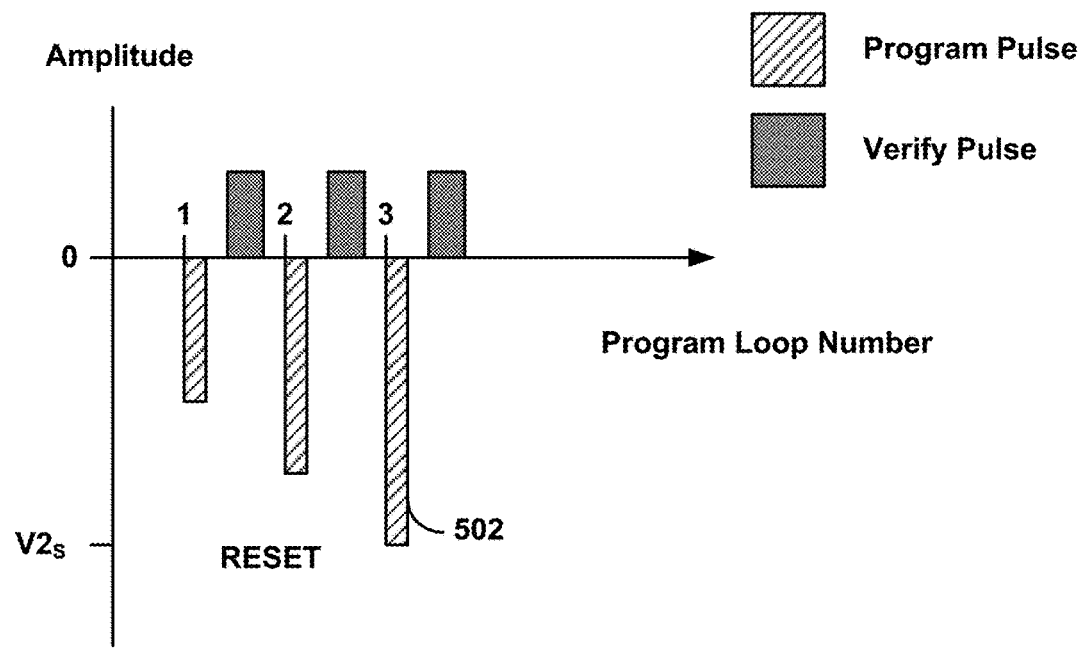

FIGS. 5A-5B illustrate example waveforms for programming memory cells, such as memory cells $M_{111}$, $M_{112}$, ..., $M_{536}$ of FIGS. 3A-3F, using an incremental step pulse programming (ISPP) method. The horizontal axis depicts a program loop number and the vertical axis depicts pulse amplitude (e.g., a word line voltage).

In an embodiment, a programming operation for a memory cell involves applying a pulse train to a selected word line coupled to the memory cell, where the pulse train includes one or more program loops. Each program loop includes a program pulse having a programming voltage, and a verify pulse having a verify voltage.

In each successive program loop, the programming voltage increases. Verify operations are performed to determine if the memory cell being programmed has reached a desired programming state (e.g., SET or RESET) and has completed programming. If programming has not completed (e.g., the memory cell verify current is not within a desired range), a next successive program loop is used with the next incremental programming voltage. When programming has completed for a memory cell (e.g., the memory cell verify current is within a desired range), the memory cell is locked out from further programming.

The programming voltage used in the last ISPP program loop before memory cell lockout is referred to herein as the "successful voltage." In other words, the "successful voltage" is the voltage of the applied ISPP program pulse that successfully programs the memory cell to the desired programming state (e.g., SET or RESET).

FIG. 5A depicts an example ISPP pulse train for programming a memory cell to a first state (e.g., SET), which in this embodiment uses positive amplitude program pulses, and FIG. 5B depicts an example ISPP pulse train for programming the memory cell to a second state (e.g., RESET), which in this embodiment uses negative amplitude program pulses. In this embodiment, each program loop includes verify pulses that have positive amplitudes for all programming operations.

In FIG. 5A, an ISPP pulse train that includes four program loops programs the memory cell to the first state (e.g., SET), with program pulse 500 being the ISPP program pulse that successfully programs the memory cell to the first state. Accordingly, the first state successful voltage is $V1_S$, the voltage of program pulse 500. Persons of ordinary skill in the art will understand that more or fewer than four program loops may be used to program a memory cell to a first state (e.g., SET).

In FIG. 5B, an ISPP pulse train that includes three program loops programs the memory cell to the second state (e.g., RESET), with program pulse 502 being the ISPP program pulse that successfully programs the memory cell to the second state. Accordingly, the second state successful voltage is $V2_S$, the voltage of program pulse 502. Persons of ordinary skill in the art will understand that more or fewer than three program loops may be used to program a memory cell to a second state (e.g., RESET).

Referring again to FIG. 4, for BMC memory cells operating in first region of operation 402 (bulk switching), programming is highly deterministic. In particular, if a first programming voltage V1 is applied to a BMC memory cell, the data state of the BMC memory cell will be (to a high degree of predictability) a first data state S1, if a second programming voltage V2 is applied to the BMC memory cell, the data state of the BMC memory cell will be (to a high degree of predictability) a second data state S2, if a third programming voltage V3 is applied to the BMC memory cell, the data state of the BMC memory cell will be (to a high degree of predictability) a third data state S3, and so on.

Likewise, referring to FIGS. 5A and 5B, after a first state successful voltage $V1_S$ (e.g., for SET programming) and a second state successful voltage $V2_S$ (e.g., for RESET programming) have been determined for a BMC memory cell, the BMC memory cell can thereafter be repeatedly programmed to the first state and the second state by repeatedly applying the first state successful voltage $V1_S$ and the second state successful voltage $V2_S$, respectively, to the BMC memory cell.

In other words, rather than requiring four program loops for first state programming and three program loops for second state programming, a single program loop using first state successful voltage $V1_S$ can be used to program the BMC memory cell to the first state, and a single program loop using second state successful voltage $V2_S$ can be used to program the BMC memory cell to the second state. Without wanting to be bound by any particular theory, it is believed that the highly deterministic programming property of BMC memory cells operating in first region of operation 402 (bulk switching) can be used to reduce programming time of BMC memory cells.

FIGS. 6A-6D depicts various embodiments of programming sequences for programming BMC memory cells. Each of the described programming sequences relies on the highly deterministic programming property of BMC memory cells operating in first region of operation 402 (bulk switching).

Figure 6A:
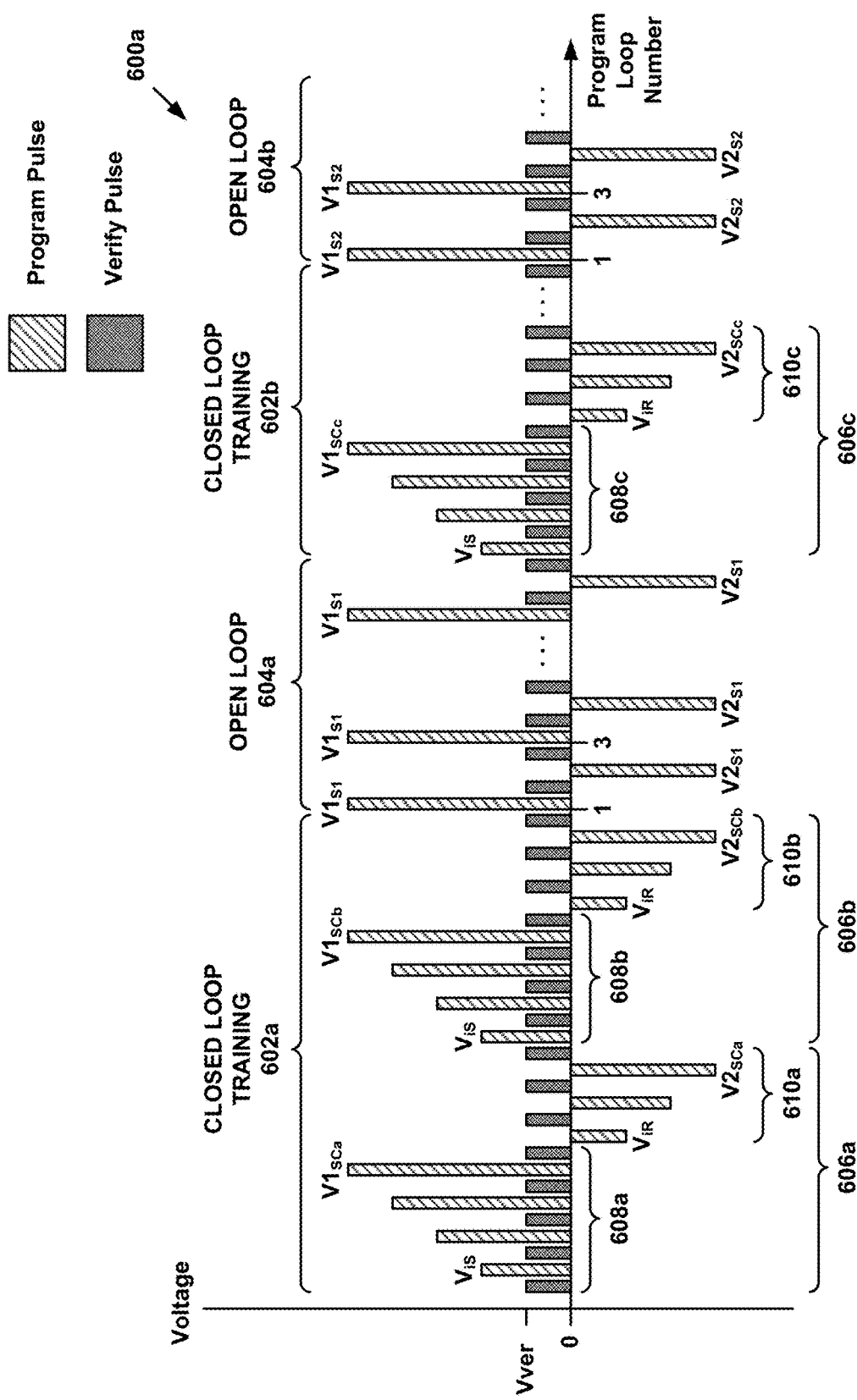
FIGS. 6A-6D depict additional embodiments of example programming sequences for programming memory cells.

FIG. 6A depicts an example pulse programming sequence 600a for programming one or more BMC memory cells, such as memory cells $M_{111}, M_{112}, \ldots, M_{536}$ of FIGS. 3A-3F. Pulse programming sequence 600a includes alternating periods of closed loop training intervals 602 and open loop programming intervals 604.

In an embodiment, each closed loop training interval 602 is used to determine a corresponding first state successful voltage $V1_S$ and a corresponding second state successful voltage $V2_S$ for first BMC memory cells.

In an embodiment, each open loop programming interval 604 is used to program second BMC memory cells to the first state and the second state using the corresponding first state successful voltage $V1_S$ and the corresponding second state successful voltage $V2_S$, respectively, determined in the preceding closed loop training interval 602.

In embodiments, first BMC memory cells are a first group of one or more BMC memory cells, and second BMC memory cells are a second group of one or more BMC memory cells. In embodiments, first BMC memory cells are a first page, a first block, or other first group of BMC memory cells, and second BMC memory cells are a second page, a second block, or other second group of BMC memory cells. In an embodiment, first BMC memory cells and second BMC memory cells include a same number of BMC memory cells. In another embodiment, first BMC memory cells and second BMC memory cells include a different number of BMC memory cells.

In an embodiment, first BMC memory cells and second BMC memory cells are the same BMC memory cells. In another embodiment, first BMC memory cells and second BMC memory cells are different BMC memory cells. In still another embodiment, first BMC memory cells are dummy BMC memory cells and second BMC memory cells are BMC memory cells in a memory array (e.g., used for host data storage). In yet another embodiment, first BMC memory cells and second BMC memory cells are both BMC memory cells in a memory array (e.g., used for host data storage).

In an embodiment, each open loop programming interval 604 includes one or more program loops, with each program loop including a program pulse having a programming voltage, and a verify pulse having a verify voltage. In an embodiment, the programming voltage has a value of corresponding first state successful voltage $V1_S$ (for programming second BMC memory cells to the first state) or corresponding second state successful voltage $V2_S$ (for programming second BMC memory cells to the second state).

In an embodiment, each open loop programming interval 604 terminates when: (1) a programming parameter for second BMC memory cells falls outside an acceptable margin (e.g., a read margin of the programmed second BMC memory cells is no longer within an acceptable range), or (2) a first predetermined number of program loops have been used to program second BMC memory cells, whichever occurs first.

Pulse programming sequence 600a includes a first closed loop training interval 602a, a first open loop programming interval 604a, a second closed loop training interval 602b, and a second open loop programming interval 604b. Persons of ordinary skill in the art will understand that pulse programming sequence 600a may include more or fewer than two closed loop training intervals 602 and two open loop programming intervals 604.

First closed loop training interval 602a is used to determine a corresponding first state successful voltage $V1_{S1}$ and a corresponding second state successful voltage $V2_{S1}$ for first BMC memory cells. First open loop programming interval 604a is used to program second BMC memory cells to the first state and the second state using corresponding first state successful voltage $V1_{S1}$ and corresponding second state successful voltage $V2_{S1}$, respectively, determined in preceding first closed loop training interval 602a.

Second closed loop training interval 602b is used to determine a corresponding first state successful voltage $V1_{S2}$ and a corresponding second state successful voltage $V2_{S2}$ for first BMC memory cells. Second open loop programming interval 604b is used to program second BMC memory cells to the first state and the second state using corresponding first state successful voltage $V1_{S2}$ and corresponding second state successful voltage $V2_{S2}$, respectively, determined in preceding second closed loop training interval 602b.

In an embodiment, each closed loop training interval 602 includes one or more ISPP training periods 606 (for simplicity, referred to herein as "ISPP training periods 606"), with each ISPP training period 606 used to determine an associated candidate first state successful voltage $V1_{SC}$ and an associated candidate second state successful voltage $V2_{SC}$ for first BMC memory cells.

In an embodiment, the corresponding first state successful voltage $V1_S$ and corresponding second state successful voltage $V2_S$ for a closed loop training interval 602 are determined based on the associated candidate first state successful voltages $V1_{SC}$ and associated candidate second state successful voltages $V2_{SC}$ determined in the ISPP training periods 606 of the closed loop training interval 602.

In an embodiment, the corresponding first state successful voltage $V1_S$ for a closed loop training interval 602 is the median of the associated candidate first state successful voltages $V1_{SC}$ determined in the ISPP training periods 606 of the closed loop training interval 602, and the corresponding second state successful voltage $V2_S$ for a closed loop training interval 602 is the median of the associated candidate second state successful voltages $V2_{SC}$ determined in the one or more ISPP training periods 606 of the closed loop training interval 602.

In another embodiment, the corresponding first state successful voltage $V1_S$ for a closed loop training interval 602 is the mean of the associated candidate first state successful voltages $V1_{SC}$ determined in the one or more ISPP training periods 606 of the closed loop training interval 602, and the corresponding second state successful voltage $V2_S$ for a closed loop training interval 602 is the mean of the associated candidate second state successful voltages $V2_{SC}$ determined in the one or more ISPP training periods 606 of the closed loop training interval 602.

In an embodiment, each closed loop training interval 602 includes a fixed number of ISPP training periods 606 (e.g., 10 ISPP training periods 606). In another embodiment, each closed loop training interval 602 includes a variable number of ISPP training periods 606, and terminates when a predetermined conditions is satisfied. In an embodiment, the predetermined condition is: (1) the associated candidate first state successful voltages $V1_{SC}$ and the associated candidate second state successful voltages $V2_{SC}$ for the ISPP training periods 606 converge (e.g., become substantially constant), or (2) a second predetermined number of ISPP training periods 606 have been used, whichever occurs first. Other predetermined conditions may be used.

In FIG. 6A, first closed loop training interval 602a is used to determine a corresponding first state successful voltage $V1_{S1}$ and a corresponding second state successful voltage $V2_{S1}$ for first BMC memory cells. To avoid overcrowding the drawings, first closed loop training interval 602a includes a first ISPP training period 606a and a second ISPP training period 606b, although more or fewer than two ISPP training periods 606 may be used.

First ISPP training period 606a includes a first ISPP pulse train 608a that programs first BMC memory cells to the first state and begins with an initial program pulse having an initial programming voltage $V_{iS}$, and a second ISPP pulse train 610a that programs first BMC memory cells to the second state and begins with an initial program pulse having an initial programming voltage $V_{iR}$. First ISPP training period 606a has an associated first state successful voltage $V1_{SCa}$, and an associated second state successful voltage $V2_{SCa}$.

Second ISPP training period 606b includes a first ISPP pulse train 608b that programs first BMC memory cells to the first state and begins with an initial program pulse having an initial programming voltage $V_{iS}$, and a second ISPP pulse train 610b that programs first BMC memory cells to the second state and begins with an initial program pulse having an initial programming voltage $V_{iR}$. Second ISPP training period 606b has an associated first state successful voltage $V1_{SCb}$, and an associated second state successful voltage $V2_{SCb}$.

In an embodiment, corresponding first state successful voltage $V1_{S1}$ for first closed loop training interval 602a is calculated as the median of the candidate first state successful voltages $V1_{SCa}$ and $V1_{SCb}$ associated with first ISPP training period 606a and second ISPP training period 606b, respectively. In an embodiment, corresponding second state successful voltage $V2_{S1}$ for first closed loop training interval 602a is calculated as the median of the candidate first state successful voltages $V2_{SCa}$ and $V2_{SCb}$ associated with first ISPP training period 606a and second ISPP training period 606b, respectively. In an embodiment, a memory controller, such as memory chip controller 104 of FIG. 1A calculates corresponding first state successful voltage $V1_{S1}$ and corresponding second state successful voltage $V2_{S1}$.

As described above, first open loop programming interval 604a is used to program second BMC memory cells to the first state and the second state using corresponding first state successful voltage $V1_{S1}$ and corresponding second state successful voltage $V2_{S1}$, respectively, determined in preceding first closed loop training interval 602a.

In particular, first open loop programming interval 604a includes one or more program loops, with each program loop including a program pulse having a programming voltage, and a verify pulse having a verify voltage. The programming voltage has a value of corresponding first state successful voltage $V1_{S1}$ (for programming second BMC memory cells to the first state) or corresponding second state successful voltage $V2_{S1}$ (for programming second BMC memory cells to the second state).

In an embodiment, first open loop programming interval 604a terminates when: (1) a programming parameter for second BMC memory falls outside an acceptable margin (e.g., a read margin of the programmed second BMC memory cells is no longer within an acceptable range), or (2) a first predetermined number of program loops have been used to program second BMC memory cells, whichever occurs first.

After first open loop programming interval 604a terminates, second closed loop training interval 602b is used to determine a corresponding first state successful voltage $V1_{S2}$ and a corresponding second state successful voltage $V2_{S2}$ for first BMC memory cells. Second closed loop training interval 602b includes a first ISPP training period 606c.

First ISPP training period 606c includes a first ISPP pulse train 608c that programs first BMC memory cells to the first state and begins with an initial program pulse having an initial programming voltage $V1_{iS}$, and a second ISPP pulse train 610c that programs first BMC memory cells to the second state and begins with an initial program pulse having an initial programming voltage $V_{iR}$. First ISPP training period 606c has an associated first state successful voltage $V1_{SCc}$, and an associated second state successful voltage $V2_{SCc}$. In an embodiment, second closed loop training interval 602b may include additional ISPP training periods 606 (not shown).

In an embodiment, corresponding first state successful voltage $V1_{S2}$ for second closed loop training interval 602b is calculated as the median of the candidate first state successful voltages (e.g., $V1_{SCc}$, . . . ) associated with first ISPP training period 606c (and any additional ISPP training periods 606 in second closed loop training interval 602b), and corresponding second state successful voltage $V2_{S2}$ for second closed loop training interval 602b is calculated as the median of the candidate first state successful voltages (e.g., $V2_{SCc}$, . . . ) associated with first training period 606c (and any additional ISPP training periods 606 in second closed loop training interval 602b). In an embodiment, a memory controller, such as memory chip controller 104 of FIG. 1A calculates corresponding first state successful voltage $V1_{S2}$ and corresponding second state successful voltage $V2_{S2}$.

As described above, second open loop programming interval 604b is used to program second BMC memory cells to the first state and the second state using corresponding first state successful voltage $V1_{S2}$ and corresponding second state successful voltage $V2_{S2}$, respectively, for second closed loop training interval 602b.

In particular, second open loop programming interval 604b includes one or more program loops, with each program loop including a program pulse having a programming voltage, and a verify pulse having a verify voltage. The programming voltage has a value of corresponding first state successful voltage $V1_{S2}$ (for programming second BMC memory cells to the first state) or corresponding second state successful voltage $V2_{S2}$ (for programming second BMC memory cells to the second state).

In an embodiment, second open loop programming interval 604b terminates when: (1) a programming parameter for second BMC memory falls outside an acceptable margin (e.g., a read margin of the programmed second BMC memory cells is no longer within an acceptable range), or (2) a first predetermined number of programming loops have been used to program second BMC memory cells, whichever occurs first.

After second open loop programming interval 604b terminates, pulse programming sequence 600a may continue with additional alternating periods of closed loop training intervals 602 used to determine corresponding first state successful voltage $V1_S$ and corresponding second state successful voltage $V2_S$ for first BMC memory cells, and open loop programming intervals 604 used to program second BMC memory cells to the first state and the second state using the corresponding first state successful voltage $V1_S$ and the corresponding second state successful voltage $V2_S$, respectively, determined in the preceding closed loop training interval 602.

As described above, in the embodiment of FIG. 6A, each open loop programming interval 604 includes one or more program loops, with each program loop including a program pulse having a programming voltage, and a verify pulse having a verify voltage. In other embodiments, open loop programming intervals 604 can be used that include no verify pulses.

Figure 6B:
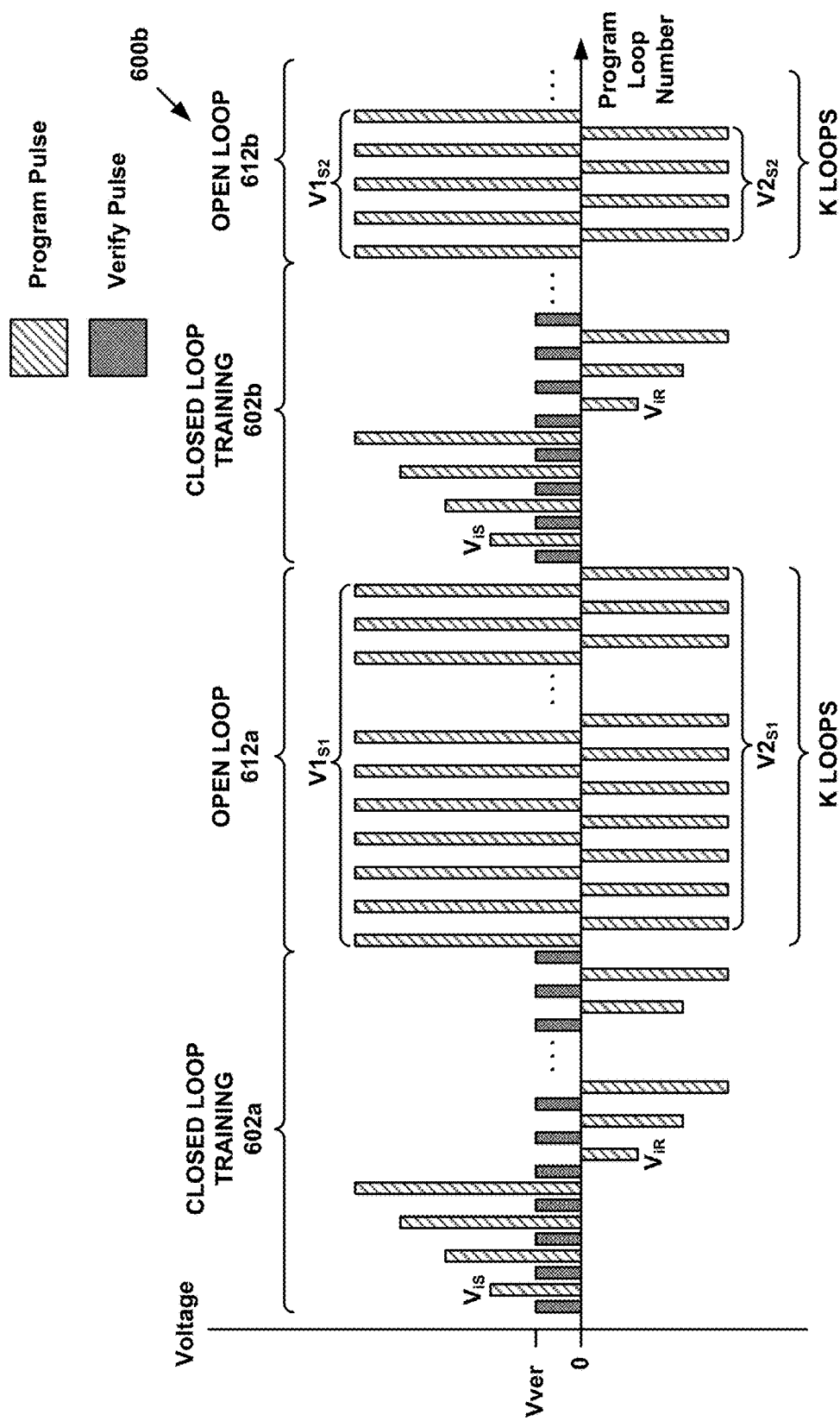

FIG. 6B depicts an example pulse programming sequence 600b for programming one or more BMC memory cells, such as memory cells $M_{111}, M_{112}, \ldots, M_{536}$ of FIGS. 3A-3F. In particular, pulse programming sequence 600b includes alternating periods of closed loop training intervals 602 used to determine corresponding first state successful voltage $V1_S$ and corresponding second state successful voltage $V2_S$ for first BMC memory cells, and open loop programming intervals 612 used to program second BMC memory cells to the first state and the second state using the corresponding first state successful voltage $V1_S$ and the corresponding second state successful voltage $V2_S$, respectively, determined in the preceding closed loop training interval 602.

As described in more detail below, each open loop programming interval 612 includes one or more program loops, with each program loop including a program pulse having a programming voltage. The program loops include no verify pulses.

Pulse programming sequence 600b includes a first closed loop training interval 602a, a first open loop programming interval 612a, a second closed loop training interval 602b, and a second open loop programming interval 612b. Persons of ordinary skill in the art will understand that pulse programming sequence 600b may include more or fewer than two closed loop training intervals 602 and two open loop programming intervals 612.

First closed loop training interval 602a is used to determine a corresponding first state successful voltage $V1_{S1}$ and a corresponding second state successful voltage $V2_{S1}$ for first BMC memory cells. First open loop programming interval 612a is used to program second BMC memory cells to the first state and the second state using corresponding first state successful voltage $V1_{S1}$ and corresponding second state successful voltage $V2_{S1}$, respectively, determined in preceding first closed loop training interval 602a.

Second closed loop training interval 602b is used to determine a corresponding first state successful voltage $V1_{S2}$ and a corresponding second state successful voltage $V2_{S2}$ for first BMC memory cells. Second open loop programming interval 612b is used to program second BMC memory cells to the first state and the second state using corresponding first state successful voltage $V1_{S2}$ and corresponding second state successful voltage $V2_{S2}$, respectively, determined in preceding second closed loop training interval 602b.

As described above, first open loop programming interval 612a is used to program second BMC memory cells to the first state and the second state using corresponding first state successful voltage $V1_{S1}$ and corresponding second state successful voltage $V2_{S1}$, respectively, determined in preceding first closed loop training interval 602a.

In particular, first open loop programming interval 612a includes a third predetermined number of program loops (e.g., K program loops), with each program loop including a program pulse having a programming voltage. In an embodiment, the programming voltage has a value of corresponding first state successful voltage $V1_{S1}$ (for programming second BMC memory cells to the first state) or corresponding second state successful voltage $V2_{S1}$ (for programming second BMC memory cells to the second state). First open loop programming interval 612a does not include any verify pulses, and terminates after the third predetermined number (K) of program loops.

In an embodiment, the third predetermined number (K) is specified based on statistical data regarding a number of program loops that may be applied to second BMC memory cells before a programming parameter falls outside an acceptable margin (e.g., a read margin of the programmed second BMC memory cells is no longer within an acceptable range). Other techniques may be used to specify the third predetermined number (K).

After first open loop programming interval 612a terminates, second closed loop training interval 602b is used to determine a corresponding first state successful voltage $V1_{S2}$ and a corresponding second state successful voltage $V2_{S2}$ for first BMC memory cells.

As described above, second open loop programming interval 612b is used to program second BMC memory cells to the first state and the second state using corresponding first state successful voltage $V1_{S2}$ and corresponding second state successful voltage $V2_{S2}$, respectively, determined in preceding second closed loop training interval 602b.

In particular, second open loop programming interval 612b includes the third predetermined number (K) of program loops, with each program loop including a program pulse having a programming voltage. In an embodiment, the programming voltage has a value of corresponding first state successful voltage $V1_{S2}$ (for programming second BMC memory cells to the first state) or corresponding second state successful voltage $V2_{S12}$ (for programming second BMC memory cells to the second state). Second open loop programming interval 612b does not include any verify pulses, and terminates after the third predetermined number (K) of program loops.

After second open loop programming interval 612b terminates, pulse programming sequence 600b continues with additional alternating periods of closed loop training intervals 602 used to determine corresponding first state successful voltage $V1_S$ and corresponding second state successful voltage $V2_S$ for first BMC memory cells, and open loop programming intervals 612 used to program second BMC memory cells to the first state and the second state using the corresponding first state successful voltage $V1_S$ and the corresponding second state successful voltage $V2_S$, respectively, determined in the preceding closed loop training interval 602.

In the embodiments described above, each open loop programming interval 604 includes verify pulses after each program pulse (FIG. 6A), or includes no verify pulses (FIG. 6B). In other embodiments, open loop programming intervals 604 include verify pulses after some, but not all program pulses.

Figure 6C:
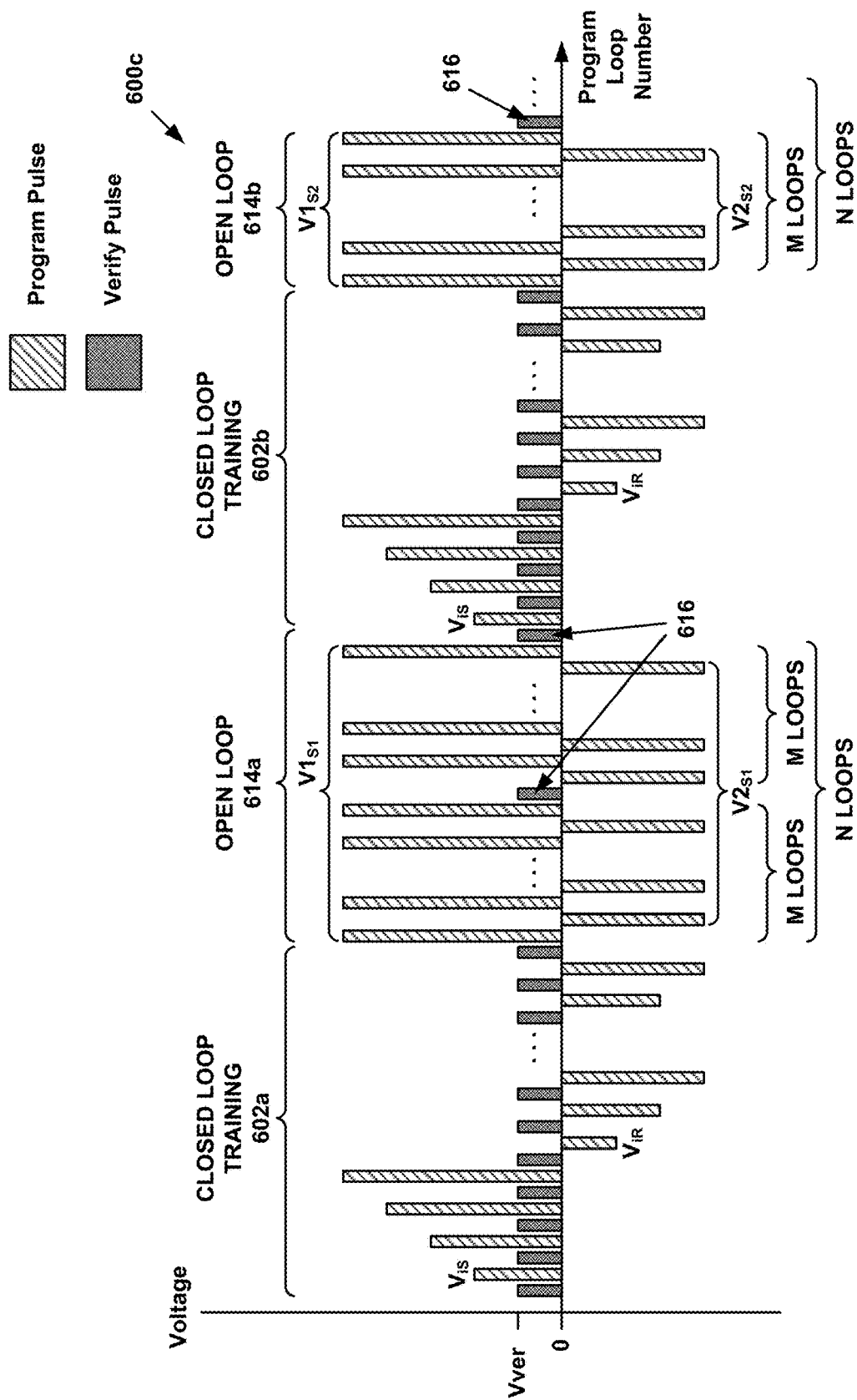

FIG. 6C depicts an example pulse programming sequence 600c for programming one or more BMC memory cells, such as memory cells $M_{111}, M_{112}, \ldots, M_{536}$ of FIGS. 3A-3F. In particular, pulse programming sequence 600c includes alternating periods of closed loop training intervals 602 used to determine corresponding first state successful voltage $V1_S$ and corresponding second state successful voltage $V2_S$ for first BMC memory cells, and open loop programming intervals 614 used to program second BMC memory cells to the first state and the second state using the corresponding first state successful voltage $V1_S$ and the corresponding second state successful voltage $V2_S$, respectively, determined in the preceding closed loop training interval 602.

As described in more detail below, each open loop programming interval 614 includes verify pulses after a fourth predetermined number of program loops, and terminates when: (1) a programming parameter for second BMC memory cells falls outside an acceptable margin (e.g., a read margin of the programmed second BMC memory cells is no longer within an acceptable range), or (2) a fifth predetermined number of program loops have been used to program second BMC memory cells, whichever occurs first.

Pulse programming sequence 600c includes a first closed loop training interval 602a, a first open loop programming interval 614a, a second closed loop training interval 602b, and a second open loop programming interval 614b. Persons of ordinary skill in the art will understand that pulse programming sequence 600b may include more or fewer than two closed loop training intervals 602 and two open loop programming intervals 614.

First closed loop training interval 602a is used to determine a corresponding first state successful voltage $V1_{S1}$ and a corresponding second state successful voltage $V2_{S1}$ for first BMC memory cells. First open loop programming interval 614a is used to program second BMC memory cells to the first state and the second state using corresponding first state successful voltage $V1_{S1}$ and corresponding second state successful voltage $V2_{S1}$, respectively, determined in preceding first closed loop training interval 602a.

Second closed loop training interval 602b is used to determine a corresponding first state successful voltage $V1_{S2}$ and a corresponding second state successful voltage $V2_{S2}$ for first BMC memory cells. Second open loop programming interval 614b is used to program second BMC memory cells to the first state and the second state using corresponding first state successful voltage $V1_{S2}$ and corresponding second state successful voltage $V2_{S2}$, respectively, determined in preceding second closed loop training interval 602b.

As described above, first open loop programming interval 614a is used to program second BMC memory cells to the first state and the second state using corresponding first state successful voltage $V1_{S1}$ and corresponding second state successful voltage $V2_{S1}$, respectively, for first closed loop training interval 602a.

In particular, first open loop programming interval 614a includes one or more iterations of a fourth predetermined number of program loops (e.g., M program loops), with each iteration followed by a verify pulse 616. Each program loop includes a program pulse having a programming voltage of corresponding first state successful voltage $V1_{S1}$ and corresponding second state successful voltage $V2_{S1}$ for programming second BMC memory cells to the first state and second state, respectively.

In an embodiment, the fourth predetermined number (M) is specified based on statistical data regarding a number of program loops that may be applied to second BMC memory cells before a programming parameter falls outside an acceptable margin (e.g., a read margin of the programmed second BMC memory cells is no longer within an acceptable range). Other techniques may be used to specify the fourth predetermined number (M).

First open loop programming interval 614a terminates when: (1) a programming parameter for second BMC memory cells (evaluated at verify pulses 616) falls outside an acceptable margin (e.g., a read margin of the programmed second BMC memory cells is no longer within an acceptable range), or (2) a fifth predetermined number of program loops (e.g., N program loops) have been used to program second BMC memory cells, whichever occurs first.

In an embodiment, the fifth predetermined number (N) is specified based on statistical data regarding a number of program loops that may be applied to second BMC memory cells before a programming parameter falls outside an acceptable margin (e.g., a read margin of the programmed second BMC memory cells is no longer within an acceptable range). Other techniques may be used to specify the fifth predetermined number (N).

After first open loop programming interval 614a terminates, second closed loop training interval 602b is used to determine a corresponding first state successful voltage $V1_{S2}$ and a corresponding second state successful voltage $V2_{S2}$ for first BMC memory cells.

As described above, second open loop programming interval 614b is used to program second BMC memory cells to the first state and the second state using corresponding first state successful voltage $V1_{S2}$ and corresponding second state successful voltage $V2_{S2}$, respectively, for second closed loop training interval 602b.

In particular, second open loop programming interval 614b includes one or more iterations of the fourth predetermined number (M) of program loops, with each iteration followed by a verify pulse 616. Each program loop includes a program pulse having a programming voltage of corresponding first state successful voltage $V1_{S2}$ and corresponding second state successful voltage $V2_{S2}$ for programming second BMC memory cells to the first state and second state, respectively.

Second open loop programming interval 614b terminates when: (1) a programming parameter for second BMC memory cells (evaluated at verify pulses 616) falls outside an acceptable margin (e.g., a read margin of the programmed second BMC memory cells is no longer within an acceptable range), or (2) the fifth predetermined number (N) of program loops have been used to program second BMC memory cells, whichever occurs first.

After second open loop programming interval 614b terminates, pulse programming sequence 600c continues with additional alternating periods of closed loop training intervals 602 used to determine corresponding first state successful voltage $V1_S$ and corresponding second state successful voltage $V2_S$ for first BMC memory cells, and open loop programming intervals 614 used to program second BMC memory cells to the first state and the second state using the corresponding first state successful voltage $V1_S$ and the corresponding second state successful voltage $V2_S$, respectively, determined in the preceding closed loop training interval 602.

In the embodiments described above and depicted in FIGS. 6A-6C, each closed loop training interval (e.g., 602a, 602b, ...) includes one or more ISPP training periods (e.g., 606a, 606b, 606c, ...), each including a first ISPP pulse train (e.g., 608a, 608b, 608c, ...) that programs first BMC memory cells to the first state and begins with initial programming voltage $V_{iS}$, and a second ISPP pulse train (e.g., 610a, 610b, 610c, ...) that programs first BMC memory cells to the second state and begins with initial programming voltage $V_{iR}$. In other embodiments, closed loop training intervals 602 use initial programming voltages based on the corresponding first state successful voltage $V1_S$ and the corresponding second state successful voltage $V2_S$, respectively, determined in the preceding closed loop training interval 602.

Figure 6D:
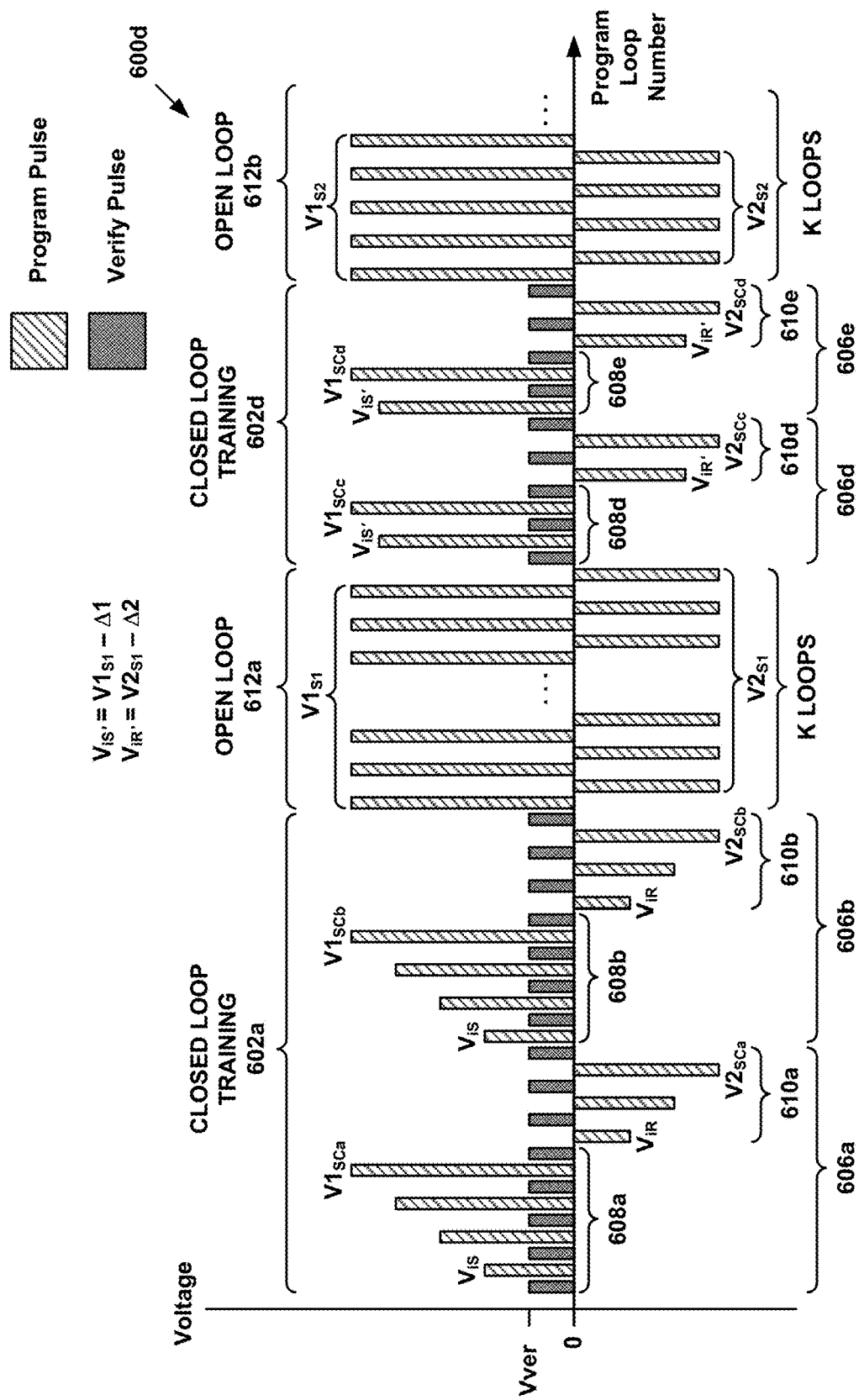

FIG. 6D depicts an example pulse programming sequence 600d for programming one or more BMC memory cells, such as memory cells $M_{111}, M_{112}, \ldots, M_{536}$ of FIGS. 3A-3F. In particular, pulse programming sequence 600d includes alternating periods of closed loop training intervals 602 used to determine corresponding first state successful voltage $V1_S$ and corresponding second state successful voltage $V2_S$ for first BMC memory cells, and open loop programming intervals 612 used to program second BMC memory cells to the first state and the second state using the corresponding first state successful voltage $V1_S$ and the corresponding second state successful voltage $V2_S$, respectively, determined in the preceding closed loop training interval 602.

First closed loop training interval 602a includes a first ISPP training period 606a and a second ISPP training period 606b. Although first closed loop training interval 602a includes two ISPP training periods 606a and 606b, persons of ordinary skill in the art will understand that first closed loop training interval 602a alternatively can include more or fewer than two ISPP training periods 606.

First ISPP training period 606a includes a first ISPP pulse train 608a that programs first BMC memory cells to the first state and begins with an initial program pulse having an initial programming voltage $V_{iS}$, and a second ISPP pulse train 610a that programs first BMC memory cells to the second state and begins with an initial program pulse having an initial programming voltage $V_{iR}$. First ISPP training period 606a has an associated first state successful voltage $V1_{SCa}$, and an associated second state successful voltage $V2_{SCa}$.

Second ISPP training period 606b includes a first ISPP pulse train 608b that programs first BMC memory cells to the first state and begins with an initial program pulse having an initial programming voltage $V_{iS}$, and a second ISPP pulse train 610b that programs first BMC memory cells to the second state and begins with an initial program pulse having an initial programming voltage $V_{iR}$. Second ISPP training period 606b has an associated first state successful voltage $V1_{SCb}$, and an associated second state successful voltage $V2_{SCb}$.

In an embodiment, corresponding first state successful voltage $V1_{S1}$ for first closed loop training interval 602a is calculated as the median of the candidate first state successful voltages $V1_{SCa}$ and $V1_{SCb}$ associated with first ISPP training period 606a and second ISPP training period 606b, respectively, and corresponding second state successful voltage $V2_{S1}$ for first closed loop training interval 602a is calculated as the median of the candidate first state successful voltages $V2_{SCa}$ and $V2_{SCb}$ associated with first ISPP training period 606a and second ISPP training period 606b, respectively. In an embodiment, a memory controller, such as memory chip controller 104 of FIG. 1A calculates corresponding first state successful voltage $V1_{S1}$ and corresponding second state successful voltage $V2_{S1}$.

First open loop programming interval 612a includes the third predetermined number (K) of program loops, with each program loop including a program pulse having a programming voltage of corresponding first state successful voltage $V1_{S1}$ and corresponding second state successful voltage $V2_{S1}$ for programming second BMC memory cells to the first state and second state, respectively. First open loop programming interval 612a does not include any verify pulses, and terminates after the third predetermined number (K) of program loops.

After first open loop programming interval 612a terminates, second closed loop training interval 602d is used to determine a corresponding first state successful voltage $V1_{S2}$ and a corresponding second state successful voltage $V2_{S2}$ for first BMC memory cells.

Second closed loop training interval 602b includes a first ISPP training period 606d and a second ISPP training period 606e. Although second closed loop training interval 602d includes two ISPP training periods 606d and 606e, persons of ordinary skill in the art will understand that second closed loop training interval 602d alternatively can include more or fewer than two ISPP training periods 606.

First ISPP training period 606d includes a first ISPP pulse train 608d that programs first BMC memory cells to the first state and begins with an initial program pulse having an initial programming voltage $V_{iS'}$, and a second ISPP pulse train 610d that programs first BMC memory cells to the second state and begins with an initial program pulse having an initial programming voltage $V_{iR'}$.

In an embodiment, first state initial programming voltage $V_{iS'}$ and second state initial programming voltage $V_{iR'}$ in second closed loop training interval 602b are based on corresponding first state successful voltage $V1_{S1}$ and corresponding second state successful voltage $V2_{S1}$, respectively, determined in preceding first closed loop training interval 602a. First ISPP training period 606d has an associated first state successful voltage $V1_{SCc}$, and an associated second state successful voltage $V2_{SCc}$.

In an embodiment, first state initial programming voltage $V_{iS'}$ and second state initial programming voltage $V_{iR'}$ in second closed loop training interval 602b are specified as:

$$V_{iS'} = V1_{S1} - \Delta 1$$

$$V_{iR'} = V2_{S1} - \Delta 2$$

where $\Delta 1$ and $\Delta 2$ are predetermined offset values. In an embodiment, a memory controller, such as memory chip controller 104 of FIG. 1A calculates first state initial programming voltage $V_{iS'}$ and second state initial programming voltage $V_{iR'}$. In an embodiment, each of $\Delta 1$ and $\Delta 2$ may be between about 0.5V to about 1V, although other values may be used.

Second ISPP training period 606e includes a first ISPP pulse train 608e that programs first BMC memory cells to the first state and begins with an initial program pulse having an initial programming voltage $V_{iS'}$, and a second ISPP pulse train 610e that programs first BMC memory cells to the second state and begins with an initial program pulse having an initial programming voltage $V_{iR'}$. Second ISPP training period 606e has an associated first state successful voltage $V1_{SCd}$, and an associated second state successful voltage $V2_{SCd}$.

In an embodiment, corresponding first state successful voltage $V1_{S2}$ for second closed loop training interval 602d is calculated as the median of the candidate first state successful voltages $V1_{SCc}$ and $V1_{SCd}$ associated with first training period 606d and second training period 606e, respectively, and corresponding second state successful voltage $V2_{S2}$ for second closed loop training interval 602d is calculated as the median of the candidate first state successful voltages $V2_{SCc}$ and $V2_{SCd}$ associated with first training period 606d and second training period 606e, respectively. In an embodiment, a memory controller, such as memory chip controller 104 of FIG. 1A calculates corresponding first state successful voltage $V1_{S2}$ and corresponding second state successful voltage $V2_{S2}$.

Second open loop programming interval 612b includes the third predetermined number (K) of program loops, with each program loop including a program pulse having a programming voltage of corresponding first state successful voltage $V1_{S2}$ and corresponding second state successful voltage $V2_{S2}$ for programming second BMC memory cells to the first state and second state, respectively. Second open loop programming interval 612b does not include any verify pulses, and terminates after the third predetermined number (K) of program loops.

Without wanting to be bound by any particular theory, it is believed that using first state initial programming voltage $V_{iS'}$ and second state initial programming voltage $V_{iR'}$ based on the corresponding first state successful voltage $V1_{S1}$ and the corresponding second state successful voltage $V2_{S1}$, respectively, determined in the preceding first closed loop training interval 602a, reduces the time required to perform second closed loop training interval 602d.

FIG. 7A depicts an embodiment of a method 700 of the disclosed technology for training and programming BMC memory cells, such as memory cells $M_{111}, M_{112}, \ldots, M_{536}$ of FIGS. 3A-3F. Method 700 may be implemented by a memory controller, such as memory chip controller 104 of FIG. 1A. At step 702, a closed loop training interval (such as closed loop training intervals 602 described above) is performed to determine a corresponding first state successful voltage $V1_S$ and a corresponding second state successful voltage $V2_S$ for first BMC memory cells. As described above, in embodiments, first BMC memory cells are a first group of one or more BMC memory cells, such as a first page, a first block, or other first group of BMC memory cells.

In an embodiment, the closed loop training interval includes one or more ISPP training periods (such as ISPP training periods 606 described above), with each ISPP training period used to determine an associated candidate first state successful voltage $V1_{SC}$ and an associated candidate second state successful voltage $V2_{SC}$. In an embodiment, the associated candidate first state successful voltages $V1_{SC}$ and associated candidate second state successful voltages $V2_{SC}$ are then used to determine the corresponding first state successful voltage $V1_S$ and corresponding second state successful voltage $V2_S$ for the closed loop training interval.

In an embodiment, the corresponding first state successful voltage $V1_S$ for the closed loop training interval of step 702 is the median of the associated candidate first state successful voltages $V1_{SC}$ determined in the one or more training periods of the closed loop training interval of step 702, and the corresponding second state successful voltage $V2_S$ for the closed loop training interval of step 702 is the median of the associated candidate second state successful voltages $V2_{SC}$ determined in the one or more training periods of the closed loop training interval of step 702.

In another embodiment, the corresponding first state successful voltage $V1_S$ of the closed loop training of step 702 interval is the mean of the associated candidate first state successful voltages $V1_{SC}$ determined in the one or more training periods of the closed loop training interval of step 702, and the corresponding second state successful voltage $V2_S$ for the closed loop training interval of step 702 is the mean of the associated candidate second state successful voltages $V2_{SC}$ determined in the one or more training periods of the closed loop training interval of step 702.

As described in more detail below, in embodiments the closed loop training interval of step 702 terminates when: a fixed number of ISPP training periods 606 have been performed, the associated candidate first state successful voltages $V1_{SC}$ and the associated candidate second state successful voltages $V2_{SC}$ for the ISPP training periods 606 converge (e.g., become substantially constant), or a second predetermined number of ISPP training periods 606 have been performed.

After closed loop training interval of step 702 terminates, at step 704 an open loop programming interval (such as open loop programming intervals 604, 612, 614 described above) is performed to program second BMC memory cells to the first state and the second state using the corresponding first state successful voltage $V1_S$ and corresponding second state successful voltage $V2_S$, respectively, determined in the preceding closed loop training interval of step 702. As described above, in embodiments, second BMC memory cells are a second group of one or more BMC memory cells, such as a second page, a second block, or other second group of BMC memory cells.

In an embodiment, the open loop programming interval of step 704 includes one or more program loops. In an embodiment, each program loop includes a program pulse having a programming voltage, and a verify pulse having a verify voltage. In an embodiment, the programming voltage has a value of corresponding first state successful voltage $V1_S$ (for programming second BMC memory cells to the first state) or corresponding second state successful voltage $V2_S$ (for programming second BMC memory cells to the second state) determined in the preceding closed loop training interval of step 702.

In an embodiment, the open loop programming interval of step 704 terminates when: (1) a programming parameter for second BMC memory cells falls outside an acceptable margin (e.g., a read margin of the programmed second BMC memory cells is no longer within an acceptable range), or (2) a first predetermined number of program loops have been used to program second BMC memory cells, whichever occurs first.

In another embodiment, the open loop programming interval of step 704 terminates after a third predetermined number of program loops. In an embodiment, each program loop includes a program pulse having a programming voltage. The program loops include no verify pulses. In an embodiment, the programming voltage has a value of corresponding first state successful voltage $V1_S$ (for programming second BMC memory cells to the first state) or corresponding second state successful voltage $V2_S$ (for programming second BMC memory cells to the second state) determined in the preceding closed loop training interval of step 702.

In another embodiment, the open loop programming interval of step 704 includes one or more iterations of a fourth predetermined number of program loops, with each iteration followed by a verify pulse. In an embodiment, each program loop includes a program pulse having a programming voltage. The program loops include no verify pulses. In an embodiment, the programming voltage has a value of corresponding first state successful voltage $V1_S$ (for programming second BMC memory cells to the first state) or corresponding second state successful voltage $V2_S$ (for programming second BMC memory cells to the second state) determined in the preceding closed loop training interval of step 702.

In another embodiment, the open loop programming interval of step 704 terminates when: (1) a programming parameter for second BMC memory cells falls outside an acceptable margin (e.g., a read margin of the programmed second BMC memory cells is no longer within an acceptable range), or (2) a fifth predetermined number of program loops have been used to program second BMC memory cells, whichever occurs first.

After the open loop programming interval of step 704 terminates, at step 706 a determination is made whether another closed loop training interval and another open loop programming interval should be performed. If yes, method 700 returns to step 702 to perform a closed loop training interval. Otherwise, method 700 terminates.

FIG. 7B depicts an embodiment of a method 702a of performing a closed loop training interval, such step 702 of FIG. 7A. Method 702a may be implemented by a memory controller, such as memory chip controller 104 of FIG. 1A. At step 708, an ISPP training period (such as an ISPP training period 606 described above) is performed. At step 710, a determination is made whether a fixed number of ISPP training periods have been performed. If at step 710 a determination is made that the fixed number have not been performed, the process returns to step 708 and another ISPP training period is performed. If at step 710 a determination is made that the fixed number have been performed, the process ends.

FIG. 7C depicts an embodiment of a method 702b of performing a closed loop training interval, such step 702 of FIG. 7A. Method 702b may be implemented by a memory controller, such as memory chip controller 104 of FIG. 1A. At step 708, an ISPP training period (such as an ISPP training period 606 described above) is performed. At step 712, a determination is made whether (1) the associated candidate first state successful voltages $V1_{SC}$ and the associated candidate second state successful voltages $V2_{SC}$ for the ISPP training periods 606 converge (e.g., become substantially constant), or (2) a second predetermined number of ISPP training periods 606 have been performed. If at step 712 a determination is made that neither condition has been satisfied, the process returns to step 708 and another ISPP training period is performed. If at step 710 a determination is made that either condition has been satisfied, the process ends.

Figure 7D:
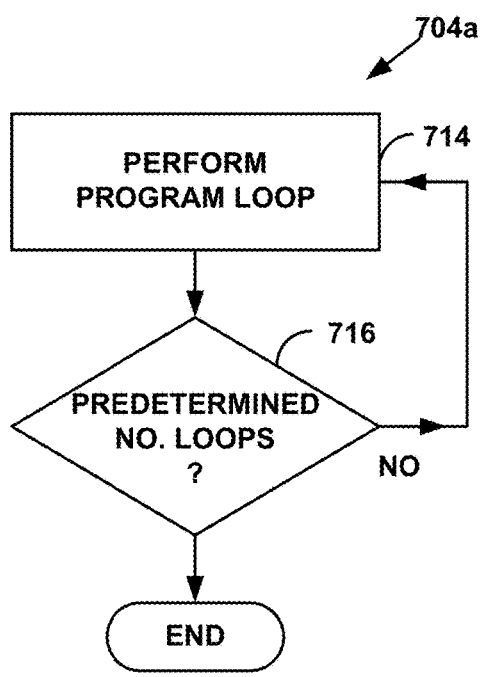

FIG. 7D depicts an embodiment of a method 704a of performing an open loop programming interval, such step 704 of FIG. 7A. Method 704a may be implemented by a memory controller, such as memory chip controller 104 of FIG. 1A. At step 714, a program loop is performed. At step 716, a determination is made whether a third predetermined number of program loops have been performed. If at step 716 a determination is made that the third predetermined number of program loops have not been performed, the process returns to step 714 and another program loop is performed. If at step 716 a determination is made that the third predetermined number of program loops has been performed, the process ends.

Figure 7E:
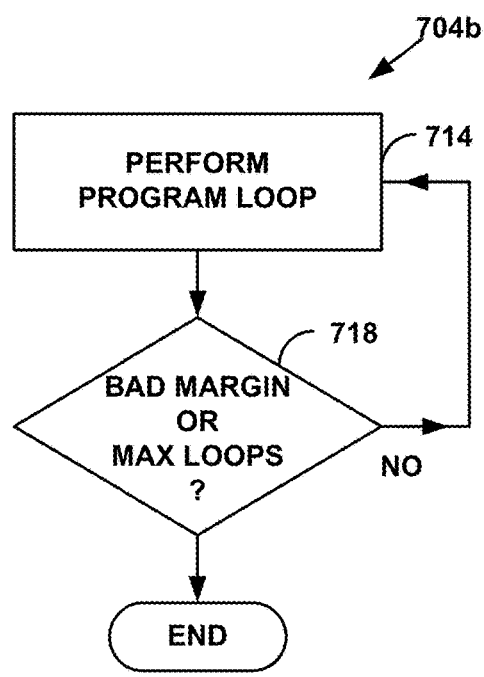

FIG. 7E depicts an embodiment of a method 704b of performing an open loop programming interval, such step 704 of FIG. 7A. Method 704b may be implemented by a memory controller, such as memory chip controller 104 of FIG. 1A. At step 714, a program loop is performed. At step 718, a determination is made whether (1) a programming parameter for second BMC memory cells falls outside an acceptable margin (e.g., a read margin of the programmed second BMC memory cells is no longer within an acceptable range), or (2) a fifth predetermined number of program loops have been performed. If at step 718 a determination is made that neither condition has been satisfied, the process returns to step 714 and another program loop is performed. If at step 718 a determination is made that either condition has been satisfied, the process ends.

Thus, as described above, one embodiment of the disclosed technology includes a memory device that includes a memory controller coupled to a memory array. The memory controller is adapted to perform a closed loop training interval and perform an open loop programming interval. The closed loop training interval determines a corresponding first state successful voltage and a corresponding second state successful voltage for a first group of memory cells each including a barrier modulated switching structure. The open loop programming interval programs a second group of memory cells each including a barrier modulated switching structure to a first state and a second state using the corresponding first state successful voltage and the corresponding second state successful voltage, respectively.

One embodiment of the disclosed technology includes a method including performing incremental step pulse programming to determine a corresponding first state successful voltage and a corresponding second state successful voltage for a first plurality of memory cells each comprising a barrier modulated switching structure, and programming a second plurality of memory cells each comprising a barrier modulated switching structure to a first state and a second state using the corresponding first state successful voltage and the corresponding second state successful voltage, respectively.

One embodiment of the disclosed technology includes a memory device that includes a memory controller coupled to a memory array. The memory controller is adapted to perform a first closed loop training interval, perform an open loop and perform a second closed loop training interval programming interval. The first closed loop training interval determines a corresponding first state successful voltage for a first group of memory cells each including a barrier modulated switching structure, by performing a first incremental step pulse programming training period that programs the first group of memory cells to a first state and begins with a first initial programming voltage. The open loop programming interval programs a second group of memory cells each including a barrier modulated switching structure to the first state using the corresponding first state successful voltage. The second closed loop training interval determines a corresponding first state successful voltage for the first group of memory cells, by performing a second incremental step pulse programming training period that programs the first group of memory cells to the first state and begins with a second initial programming voltage based on the corresponding first state successful voltage.

For purposes of this document, each process associated with the disclosed technology may be performed continuously and by one or more computing devices. Each step in a process may be performed by the same or different computing devices as those used in other steps, and each step need not necessarily be performed by a single computing device.

For purposes of this document, reference in the specification to "an embodiment," "one embodiment," "some embodiments," or "another embodiment" may be used to described different embodiments and do not necessarily refer to the same embodiment.

For purposes of this document, a connection can be a direct connection or an indirect connection (e.g., via another part).

For purposes of this document, the term "set" of objects may refer to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The invention claimed is:

1. A memory device comprising:
a memory controller coupled to a memory array, wherein the memory controller is adapted to:
perform a closed loop training interval to determine a corresponding first state successful voltage and a corresponding second state successful voltage for a first plurality of memory cells each comprising a barrier modulated switching structure; and
perform an open loop programming interval to program a second plurality of memory cells each comprising a barrier modulated switching structure to a first state and a second state using the corresponding first state successful voltage and the corresponding second state successful voltage, respectively.

2. The memory device of claim 1, wherein the first plurality of memory cells comprises a first page of memory cells, and the second plurality of memory cells comprises a second page of memory cells.

3. The memory device of claim 1, wherein the first plurality of memory cells and the second plurality of memory cells comprise the same memory cells.

4. The memory device of claim 1, wherein the first plurality of memory cells and the second plurality of memory cells comprise different memory cells.

5. The memory device of claim 1, wherein performing a closed loop training interval comprises performing a plurality of incremental step pulse programming training periods, each incremental step pulse programming training period comprising an associated candidate first state successful voltage and an associated candidate second state successful voltage for the first plurality of memory cells.

6. The memory device of claim 5, wherein the corresponding first state successful voltage comprises a median of the associated candidate first state successful voltages, and the corresponding second state successful voltage comprises a median of the associated candidate second state successful voltages.

7. The memory device of claim 5, wherein the corresponding first state successful voltage comprises a mean of the associated candidate first state successful voltages, and the corresponding second state successful voltage comprises a mean of the associated candidate second state successful voltages.

8. The memory device of claim 1, wherein performing an open loop programming interval comprises implementing a plurality of program loops each comprising a program pulse.

9. The memory device of claim 8, wherein each program loop further comprises a verify pulse.

10. The memory device of claim 1, wherein performing an open loop programming interval comprises implementing a plurality of program loops none of which comprise a verify pulse.

11. The memory device of claim 1, wherein performing an open loop programming interval comprises implementing a plurality of program loops each comprising a program pulse, wherein some but not all program loops comprise a verify pulse.

12. The memory device of claim 1, wherein the memory controller is further adapted to terminate the open loop programming interval when a predetermined number of program loops have been used to program the second plurality of memory cells.

13. The memory device of claim 1, wherein the memory controller is further adapted to terminate the open loop programming interval when a programming parameter for the second plurality of memory cells falls outside an acceptable margin, or a predetermined number of program loops have been used to program the second plurality of memory cells, whichever occurs first.

* * * * *